United States Patent [19]

Maresca et al.

[11] Patent Number: 5,574,445

[45] Date of Patent: Nov. 12, 1996

[54] DIGITAL ABSOLUTE POSITION ENCODERS

[75] Inventors: Robert L. Maresca, Milford, Mass.; James A. Parison, Jr., Fitzwilliam, N.H.; Thomas A. Froeschle, Southboro, Mass.; John J. Breen, Southboro, Mass.; Christopher H. Perry, Southboro, Mass.

[73] Assignee: Bose Corporation, Framingham, Mass.

[21] Appl. No.: 351,838

[22] Filed: Dec. 8, 1994

[51] Int. Cl.⁶ .................................................. H03M 1/22
[52] U.S. Cl. ..................... 341/10; 341/11; 341/13; 341/5
[58] Field of Search ................................ 341/1, 5, 9, 10, 341/13, 3, 11

[56] References Cited

U.S. PATENT DOCUMENTS

| | | | |
|---|---|---|---|
| 3,653,015 | 3/1972 | Rock | 340/870.22 |
| 4,736,187 | 4/1988 | Kibrick et al. | 341/3 |
| 4,766,376 | 8/1988 | Takahashi et al. | 324/208 |
| 4,965,503 | 10/1990 | Watanabe et al. | 318/671 |
| 4,970,511 | 11/1990 | Mills | 341/13 |
| 5,029,304 | 7/1991 | Tolmie, Jr. | 341/15 |
| 5,091,643 | 2/1992 | Okutani et al. | 250/231.14 |
| 5,438,330 | 10/1992 | Yamazaki et al. | 341/11 |

OTHER PUBLICATIONS

"Modular and Linear Encoders", Gurley Precision Instruments, Bulletin 8500.
"8–Bit Absolute", BEI Motion Systems Company.
"Dynapar Brand Encoder Product", Dynapar/Veeder–Root, Mar. 1994, pp. 8.01–8.03.
"There are two basic encoder styles", BEI Optical Encoder Design Guide, pp. 4–5.
"Hall Effect IC Applications Guide", Allegro Micro Systems Inc., pp. 4–73.
"Maxon Motor", Maxon Precision Motors, Inc., Edition 94/95, pp. 22–26.

*Primary Examiner*—Jeffrey A. Gaffin
*Assistant Examiner*—Jason L. W. Kost
*Attorney, Agent, or Firm*—Fish & Richardson P.C.

[57] ABSTRACT

A digital absolute position encoder is provided for determining absolute position of a first member with respect to a second member. The absolute position is determined within a resolution cell of $L/2^n$, where n is an integer and L is a predetermined span. One of the members has a plurality of, m, tracks of binary indicia distributed over the predetermined span, L, where m is an integer less than n. The other member has a plurality of indicia detectors disposed on the second member for detecting the binary indicia. With such an arrangement, an encoder is provided having "a unit-distance code", yet uses less tracks than that used with a conventional Gray code encoder. Further, the encoder has a reduced number of transitions than that required on the track used with a conventional Gray code encoder. Both of these features simplify the design and fabrication for a given encoder resolution.

16 Claims, 31 Drawing Sheets

FIG. 3A

| Binary Indicia of Track | | Detector Location at Pos Zero | | Detectors | | | | | | | Combinational Logic Outputs | | | | | Position |
|---|---|---|---|---|---|---|---|---|---|---|---|---|---|---|---|---|
| 18 | 16 | 18 | 16 | $24_1$ | $24_2$ | $24_3$ | $24_4$ | $26_1$ | $26_2$ | $26_3$ | $G_4$ | $G_3$ | $G_2$ | $G_1$ | $G_0$ | |
| 0 | 0 | | $24_4$ | 0 | 0 | 0 | 0 | 0 | 0 | 0 | 0 | 0 | 0 | 0 | 0 | 0 |
| 0 | 0 | $26_3$ | | 0 | 0 | 0 | 0 | 1 | 1 | 0 | 0 | 0 | 0 | 0 | 1 | 1 |
| 0 | 0 | $26_2$ | | 0 | 0 | 0 | 0 | 1 | 1 | 1 | 0 | 0 | 0 | 1 | 1 | 2 |
| 0 | 0 | $26_1$ | | 0 | 0 | 0 | 1 | 1 | 1 | 1 | 0 | 0 | 0 | 1 | 0 | 3 |
| 1 | 0 | | | 1 | 0 | 0 | 1 | 1 | 1 | 1 | 0 | 0 | 1 | 1 | 0 | 4 |
| 1 | 0 | | $24_3$ | 1 | 0 | 0 | 1 | 0 | 1 | 1 | 0 | 0 | 1 | 1 | 1 | 5 |
| 1 | 0 | | | 1 | 0 | 0 | 1 | 0 | 0 | 1 | 0 | 0 | 1 | 0 | 1 | 6 |
| 1 | 0 | | | 1 | 0 | 0 | 1 | 0 | 0 | 0 | 0 | 0 | 1 | 0 | 0 | 7 |
| 0 | 0 | | $24_2$ | 1 | 1 | 0 | 1 | 0 | 0 | 0 | 0 | 1 | 1 | 0 | 0 | 8 |
| 0 | 0 | | | 1 | 1 | 0 | 1 | 1 | 0 | 0 | 0 | 1 | 1 | 0 | 1 | 9 |
| 0 | 0 | | | 1 | 1 | 0 | 1 | 1 | 1 | 1 | 0 | 1 | 1 | 1 | 1 | 10 |
| 0 | 1 | | $24_1$ | 1 | 1 | 0 | 0 | 1 | 1 | 1 | 0 | 1 | 1 | 1 | 0 | 11 |
| 1 | 1 | | | 1 | 1 | 1 | 0 | 0 | 1 | 1 | 0 | 1 | 0 | 1 | 0 | 12 |
| 1 | 1 | | | 1 | 1 | 1 | 0 | 0 | 0 | 1 | 0 | 1 | 0 | 1 | 1 | 13 |
| 1 | 1 | | | 1 | 1 | 1 | 0 | 0 | 0 | 0 | 0 | 1 | 0 | 0 | 1 | 14 |

| FIG. 3A |
|---|
| FIG. 3B |

FIG. 3

| Binary Indicia of Track | | Detector Location at Pos Zero | | Detectors | | | | | | | Combinational Logic Outputs | | | | | Position |
|---|---|---|---|---|---|---|---|---|---|---|---|---|---|---|---|---|
| 18 | 16 | 18 | 16 | $26_3$ | $26_2$ | $26_1$ | $24_4$ | $24_3$ | $24_2$ | $24_1$ | $G_4$ | $G_3$ | $G_2$ | $G_1$ | $G_0$ | |
| 1 ($22_{16}$) | 0 ($20_{16}$) | | | 0 | 0 | 0 | 0 | 1 | 1 | 1 | 0 | 1 | 0 | 0 | 0 | 15 |
| 0 | 1 | | | 0 | 0 | 0 | 1 | 1 | 1 | 1 | 1 | 1 | 0 | 0 | 0 | 16 |
| 0 | 1 | | | 0 | 0 | 1 | 1 | 1 | 1 | 1 | 1 | 1 | 0 | 0 | 1 | 17 |
| 0 | 1 | | | 0 | 1 | 1 | 1 | 1 | 1 | 1 | 1 | 1 | 0 | 1 | 1 | 18 |
| 1 | 1 | | | 1 | 1 | 1 | 1 | 1 | 1 | 1 | 1 | 1 | 0 | 1 | 0 | 19 |
| 1 | 1 | | | 1 | 1 | 1 | 1 | 1 | 1 | 0 | 1 | 1 | 1 | 1 | 0 | 20 |
| 1 | 1 | | | 1 | 1 | 1 | 1 | 1 | 0 | 0 | 1 | 1 | 1 | 1 | 1 | 21 |
| 1 | 1 | | | 1 | 1 | 1 | 1 | 0 | 0 | 0 | 1 | 1 | 1 | 0 | 1 | 22 |
| 0 | 1 | | | 1 | 1 | 1 | 0 | 0 | 0 | 0 | 1 | 1 | 1 | 0 | 0 | 23 |
| 0 | 1 | | | 1 | 1 | 0 | 0 | 0 | 0 | 0 | 1 | 0 | 1 | 0 | 0 | 24 |
| 0 | 1 | | | 1 | 0 | 0 | 0 | 0 | 0 | 0 | 1 | 0 | 1 | 0 | 1 | 25 |
| 1 | 1 | | | 0 | 0 | 0 | 0 | 0 | 0 | 1 | 1 | 0 | 1 | 1 | 1 | 26 |
| 1 | 1 | | | 0 | 0 | 0 | 0 | 0 | 1 | 1 | 1 | 0 | 1 | 1 | 0 | 27 |
| 1 | 1 | | | 0 | 0 | 0 | 0 | 1 | 1 | 0 | 1 | 0 | 0 | 1 | 0 | 28 |
| 1 | 1 | | | 0 | 0 | 0 | 1 | 1 | 0 | 0 | 1 | 0 | 0 | 1 | 1 | 29 |
| 1 | 1 | | | 0 | 0 | 1 | 1 | 0 | 0 | 0 | 1 | 0 | 0 | 0 | 1 | 30 |
| * ($22_{32}$) | * ($20_{32}$) | | | 0 | 1 | 0 | 0 | 0 | 0 | 0 | 1 | 0 | 0 | 0 | 0 | 31 |

*BINARY INDICIA $22_{33}-22_{36}$, $22_{41}-22_{44}$, ARE EACH LOGICAL 0;

BINARY INDICIA $22_{37}-22_{40}$, ARE EACH LOGICAL 1

FIG. 3B

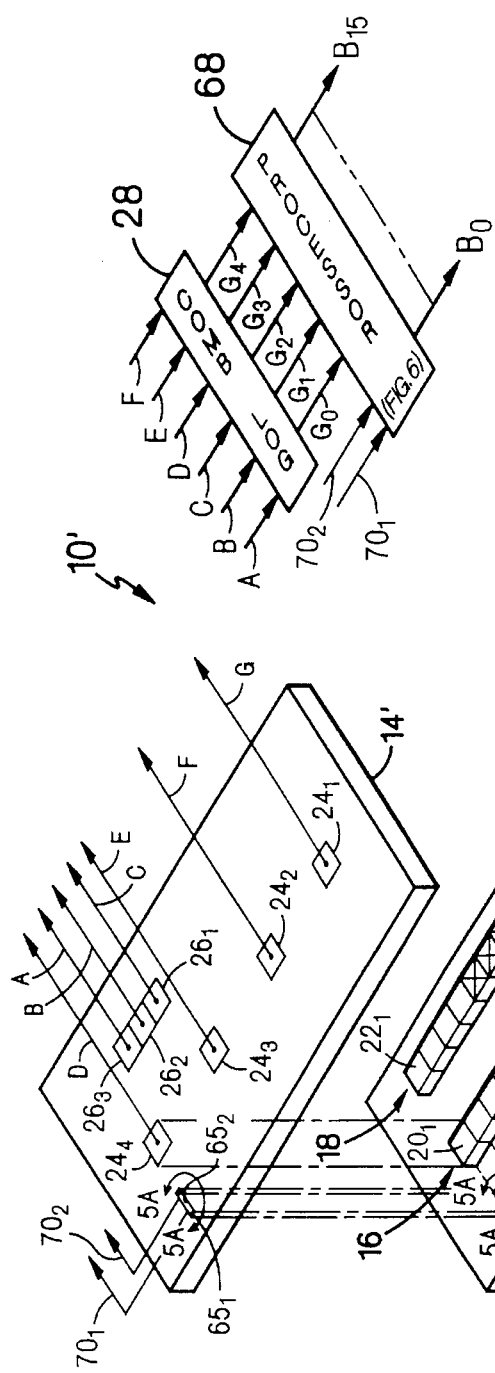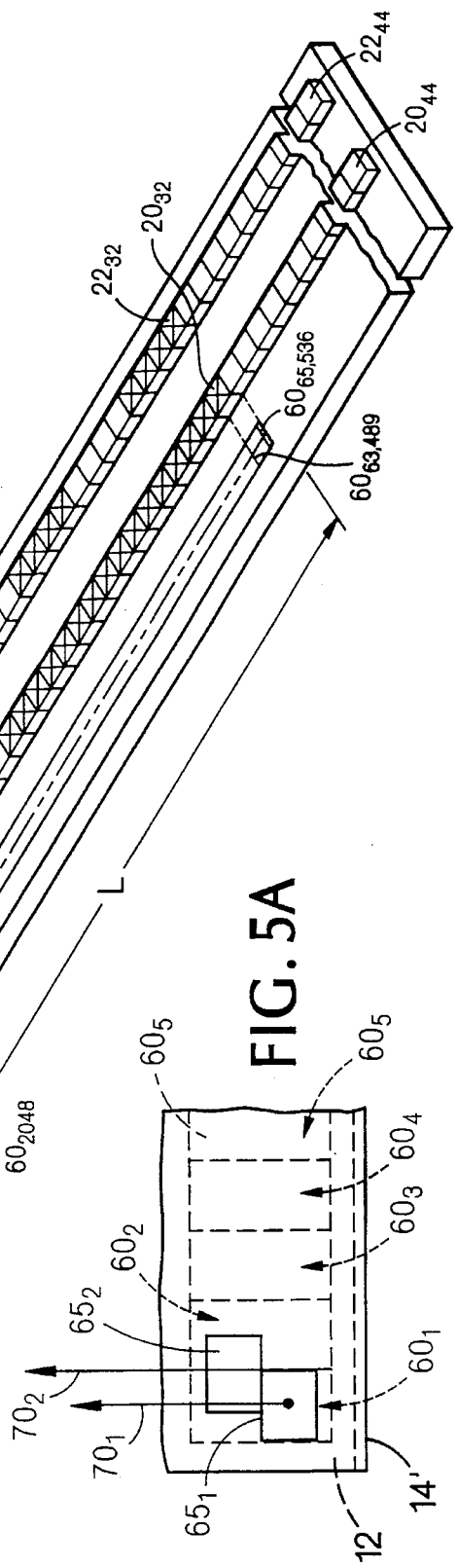
FIG. 5
FIG. 5A

BINARY INDICIA $46_{513}$-$46_{704}$, $44_{513}$-$44_{704}$, $42_{513}$-$42_{704}$, ARE EACH LOGICAL 0

DIGITAL ABSOLUTE POSITION ENCODERS

This invention relates generally to digital absolute position encoders, and more particularly to encoders of such type which are adapted to provide a "unit-distance", cyclic code, such as a Gray code.

As is known in the art, it is frequently desired to determine the position of one member with respect to a second member. One way to obtain such relative position is to place a code on one of the members and a detector on the other member. One such arrangement is described in an article entitled "Absolute Encoders Provide Precise Position Information" by Gregg Stokely published in the April 1994 issue of PCIM on pages 40–49. As described therein, if system needs are to measure travel of a screw, for example, in 0,001-inch increments over 25 inches, then a linear encoder of 25,000 words is required. Likewise, with an angle encoder, if angles over 360 degrees are to be measured to 0.1 degrees, then 3600 words are required. Thus, in the general case, if a span to be measured is L, and such span, L, is to be measured to within a resolution cell, C, the number of words to be encoded is L/C. With digital encoders, the words are typically binary word signals having n bits. Thus, the number of binary word signals is typically $2^n$, where n is an integer, and the resolution cell, C, is $L/2^n$.

As described in the above referenced article, each position, or resolution cell, on one of the members is identified by a unique digital code, or binary word. No two positions have the same binary word so that the exact position of one member relative to the other member is always known. This feature of an absolute encoder, as distinguished from an incremental encoder, is important in those cases where power is turned off and there is relative motion during the time such power is off. With an absolute position encoder, the exact position of one member relative to the other is always precisely determined once power to the system is reapplied, even if the relative position of the members had changed when the power was off. True position is always available from the absolute encoder without the need to continuously monitor the encoder as in the case of an incremental encoder. This unique capability makes absolute encoders the preferred sensor for applications that require a true indication of position at all times due to machine or operator safety concerns or where the system cannot be easily returned to a reference or home position for "zeroing".

Conventional digital position encoders employ optical sensors to detect a pattern of binary indicia; typically opaque and transparent segments on multiple tracks. These segments or indicia, can be holes in a material or a photographically painted set of lines on glass or plastic. It is common to use a natural binary code or a Gray code pattern, as described in the above referenced article. The natural binary and Gray code pattern each require "n" tracks and "n" sensors to resolve the $2^n$ unique binary word signals. That is, at each position, or cell, a unique one of the $2^n$ binary word signals is encoded; each bit of the n bits of each word signal being encoded as a binary indicium on a corresponding one of the n tracks. A natural binary code assigns the power of 2 to the code tracks. For example, the least significant bit track represents $2^0$ while the most significant bit track represents $2^n$. One well-documented problem with this natural binary code is that at certain transitions from one word signal to the next, many bits of the word signal change logic states. One example is the transition from $(7)_{10}$ (i.e., $(0111)_2$) to $(8)_{10}$ (i.e., $(1000)_2$), where the subscript 10 indicates base 10 and the subscript 2 indicates base 2. Note, in this example, all bits change logic state. This can be problematic if sampling data since there can be a skew between transitions of each bit, and a sample could be taken in the midst of the change. The Gray code pattern has the important property that only one bit changes from one word signal to the next. A code that exhibits this property is sometimes referred to as "unit-distance code", and the use of this type of code will generally ensure that a sampled system will have an ambiguity of, at most, one least significant bit. Further, a code which only has one bit change when going from the end of the span to the beginning of the span is sometimes referred to as a "cyclic" code. Such code is useful with a closed geometric span, such as a circle. The Gray code is a "unit-distance", "cyclic" code.

In accordance with the present invention, a digital absolute encoder is provided for determining absolute position of a first member with respect to a second member. The absolute position is determined within a cell resolution of $L/2^n$, where n is an integer and L is a predetermined span. One of the members has a plurality of, m, tracks of binary indicia distributed over the predetermined span, L, where m is an integer less than n. The other member has a plurality of binary indicia detectors for detecting the binary, or logic, state of the binary indicia.

With such an arrangement, an encoder is provided having a "cyclic", "unit-distance code", yet uses fewer tracks than that used with the above-described Gray code. Further, this encoder has a reduced number of transitions than that required on the track used with the above described Gray code. Both of these features simplify the design and fabrication for a given encoder resolution.

In accordance with another feature of the invention, an encoder is provided for determining absolute position of a first member with respect to a second member, such absolute position being determined to within a resolution of $L/2^n$ where n is an integer and L is a predetermined span The span may be a linear span, arcuate, circular, or other curved span. The encoder has a plurality of, m, tracks of binary state indicia disposed in a predetermined pattern on, and distributed over, the predetermined span, L, of the first member, where m is an integer less than n. The second member has disposed thereon a plurality of binary state detectors. The detectors are disposed on, and at predetermined positions of, the second member. The detectors are adapted to detect a portion of the binary state indicia in predetermined orientation with such detectors. Circuitry is provided to convert the logic states of the portion of the binary state indicia in predetermined orientation with the detectors into a corresponding one of $2^n$ numbers to indicate the relative position of the members.

In accordance with another feature of the invention, an encoder is provided having a first encoder section for determining the main portion of the position of a first member with respect to a second member and a second encoder for determining a vernier portion of such position.

In accordance with still another feature of the invention, an encoder is provided having a plurality of tracks of binary state indicia disposed in a predetermined pattern on, and distributed over, the first member. The second member is adapted to move relative to the first member has disposed thereon a plurality of sets of binary state detectors. Each set of detectors is adapted to detect the binary state indicia of a corresponding one of the tracks of binary indicia. A bearing is provided to enable relative movement between the first and second members. One portion of the tracks and the set of detectors corresponding thereto is disposed on one side of the bearing and another portion of the tracks and the set of detectors corresponding thereto is disposed on another side of the bearing with the one portion of the tracks and the set of detectors corresponding thereto separated from the another portion of the tracks and the set of detectors corresponding thereto by a surface parallel to the path of relative movement between the first and second members and perpendicular to the plane of the tracks.

Other features, objects and advantages will become apparent from the following detailed description when read in connection with the drawing, in which.

Figure 1:
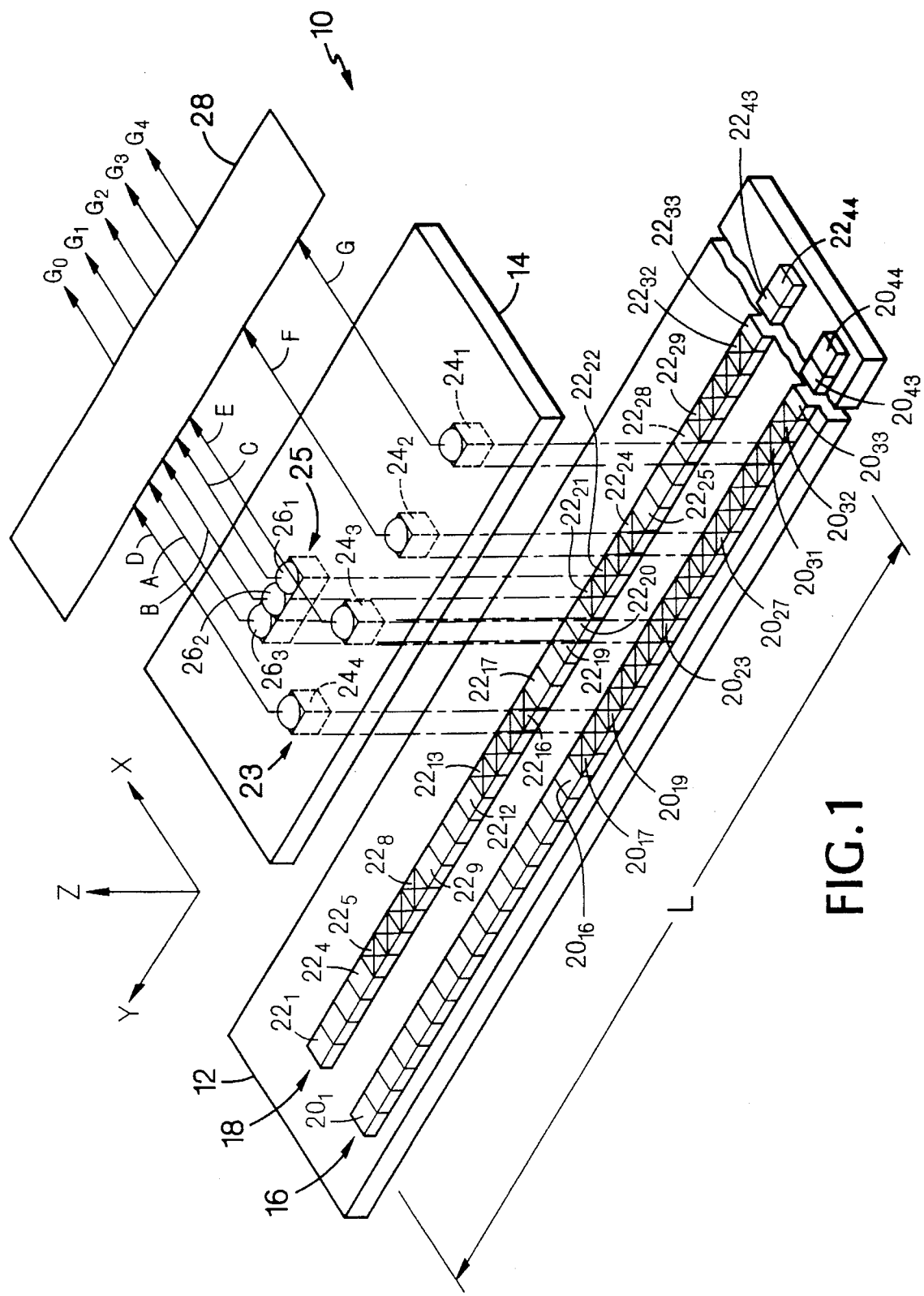
FIG. 1 is an exploded isometric drawing of an encoder according to the invention.
Figure 4A:
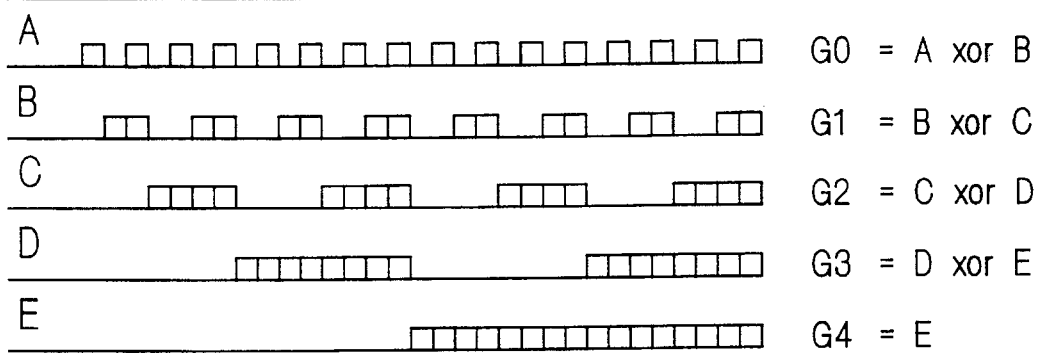
Figure 4B:
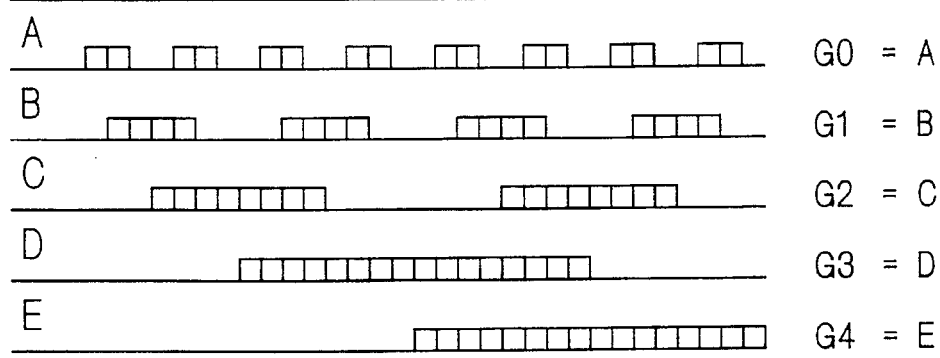
Figure 4C:
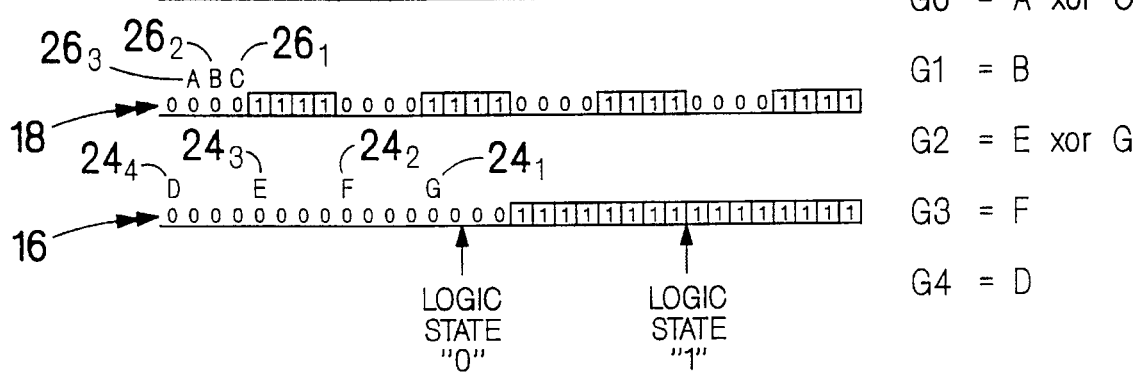
Figure 6:
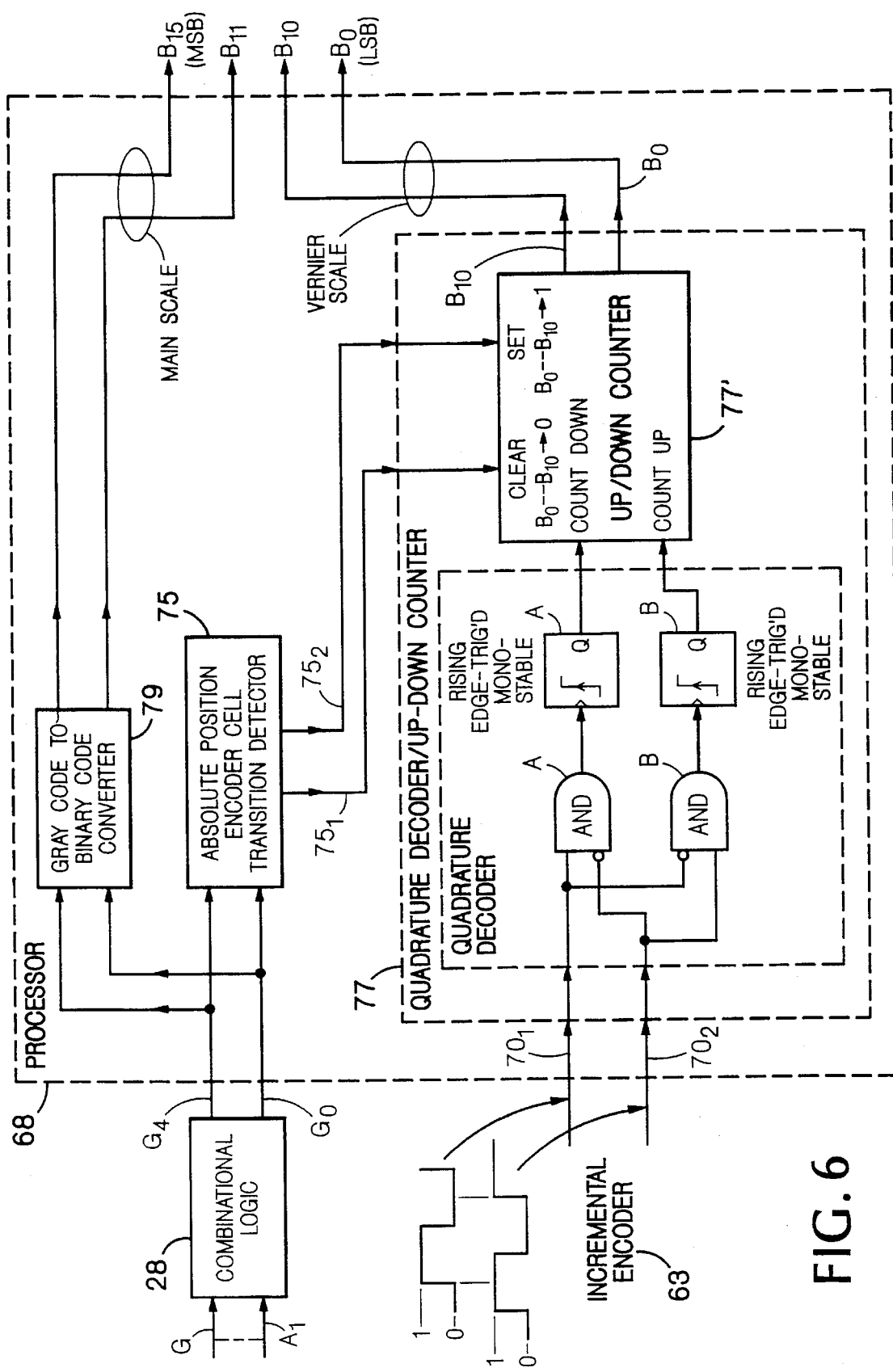
Figure 7:
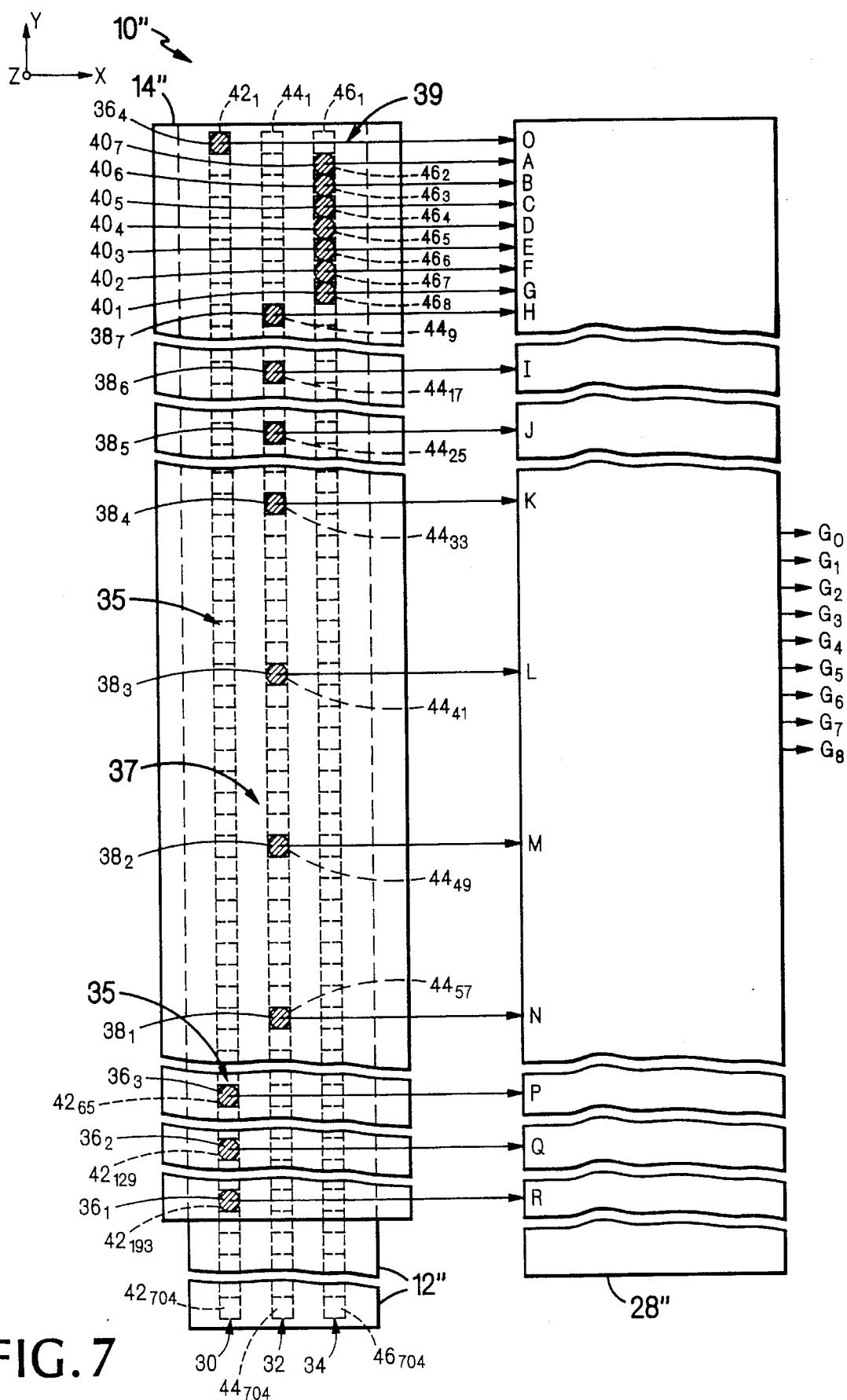
Figure 8:
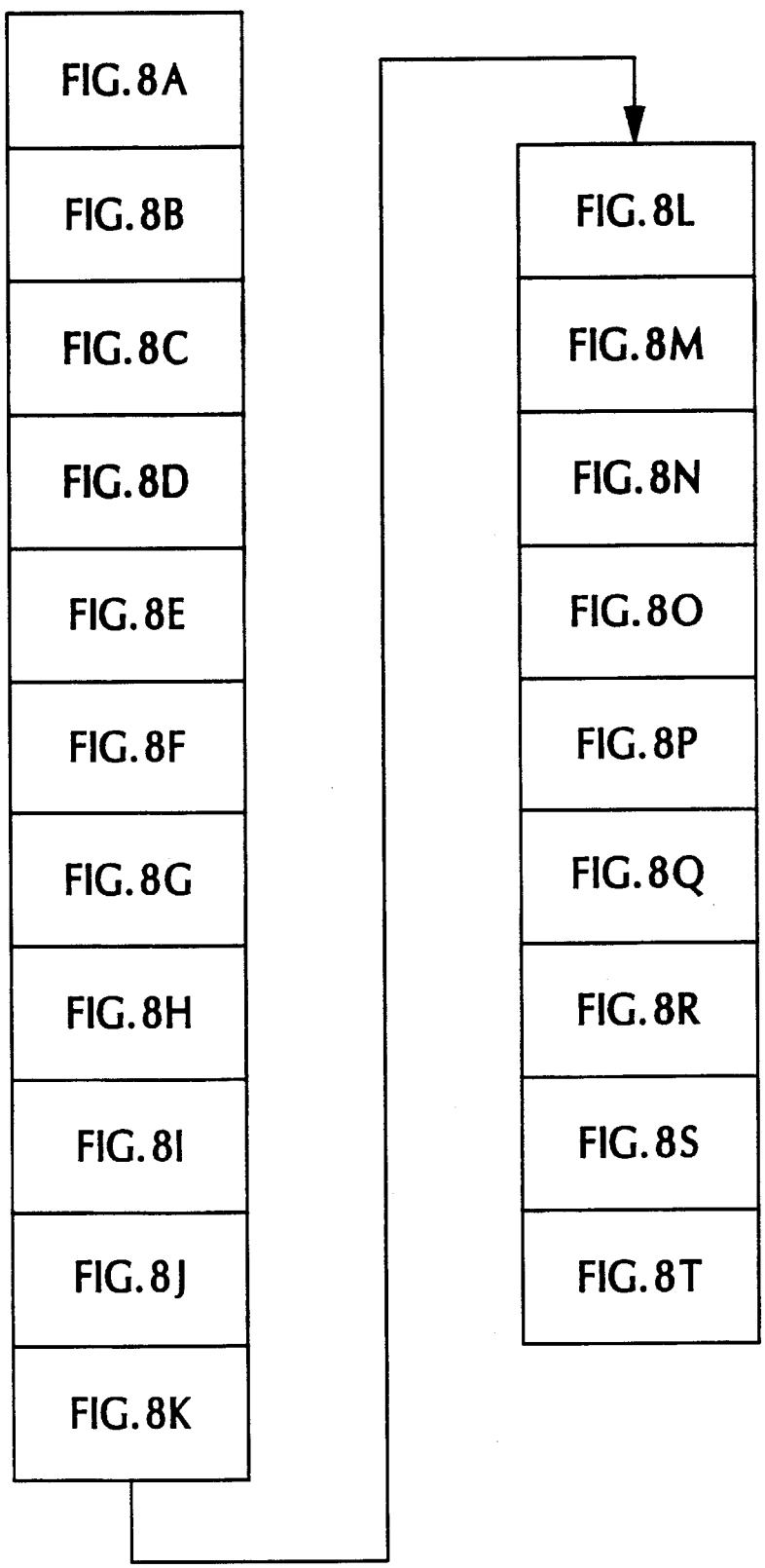
Figure 8T:
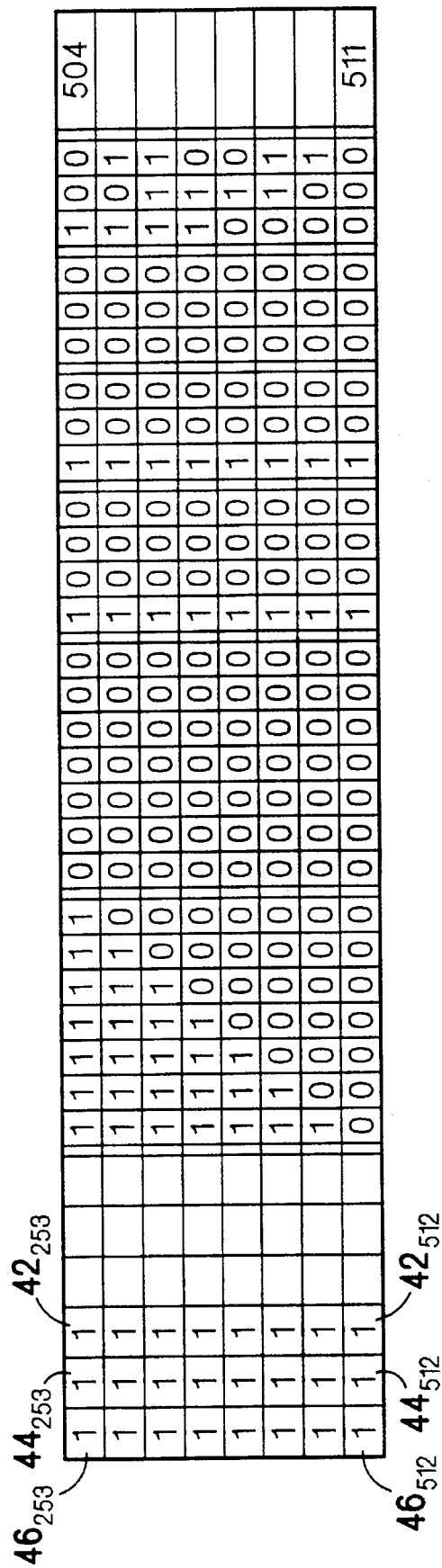
Figure 9:
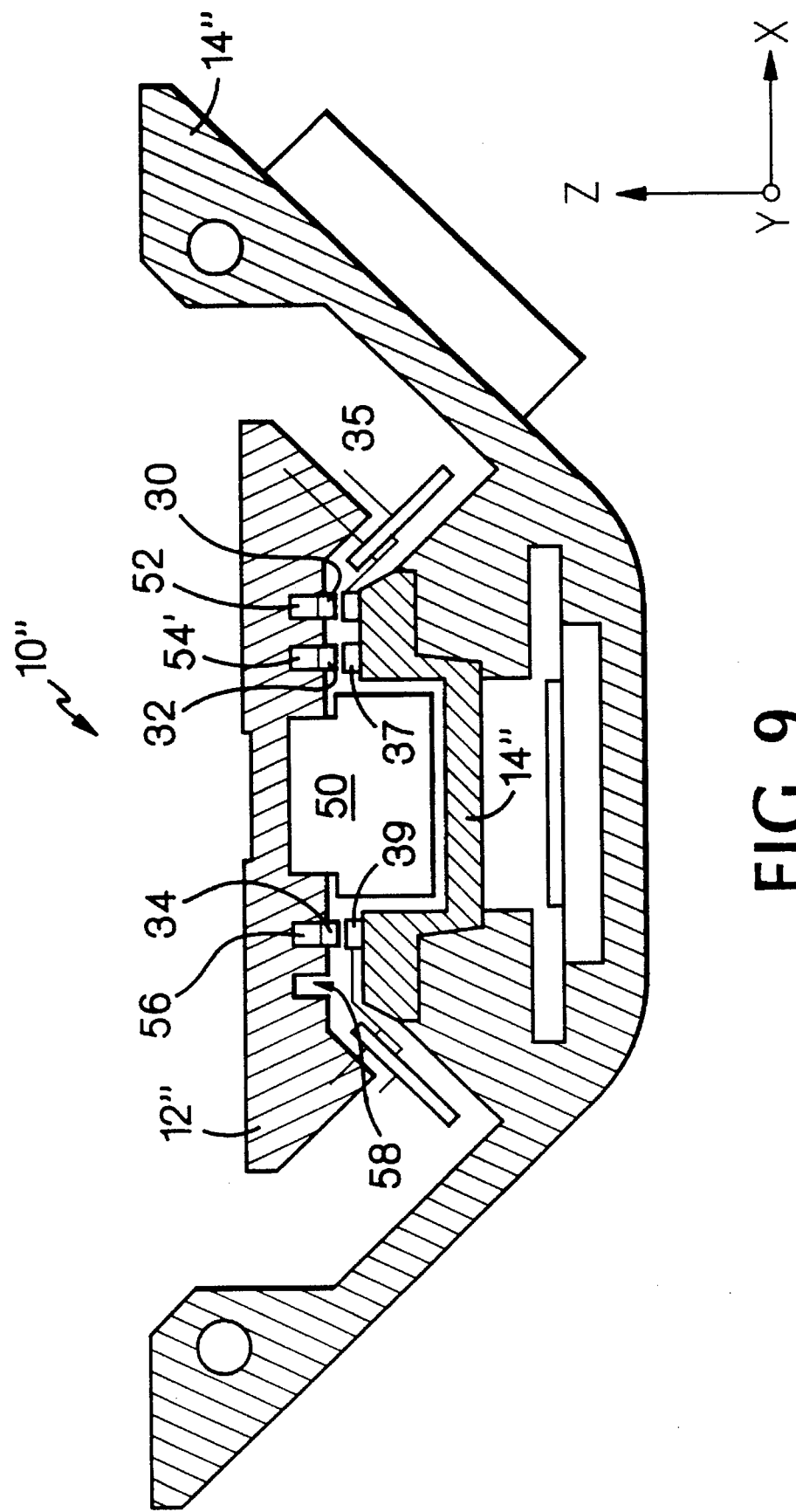

FIGS. 3A and 3B, together, in the arrangement shown in FIG. 3, is a truth table for the encoder of FIG. 1;

FIGS. 4A, 4B, and 4C, together illustrate the difference between encoder in accordance with the prior art, as shown in FIGS. 4A and 4B; and, an encoder according to the invention, as shown in FIG. 4C;

FIG. 5 is a diagrammatical sketch showing an encoder according to the invention; FIG. 5A being an enlarged portion of FIG. 5, such enlarged portion being enclosed by a circular arrow indicated by 5A—5A;

FIG. 6 is a block diagram of a processor used with the encoder of FIG. 5;

FIG. 7 is a contracted plan view of an encoder according to the invention;

Figure 8A:
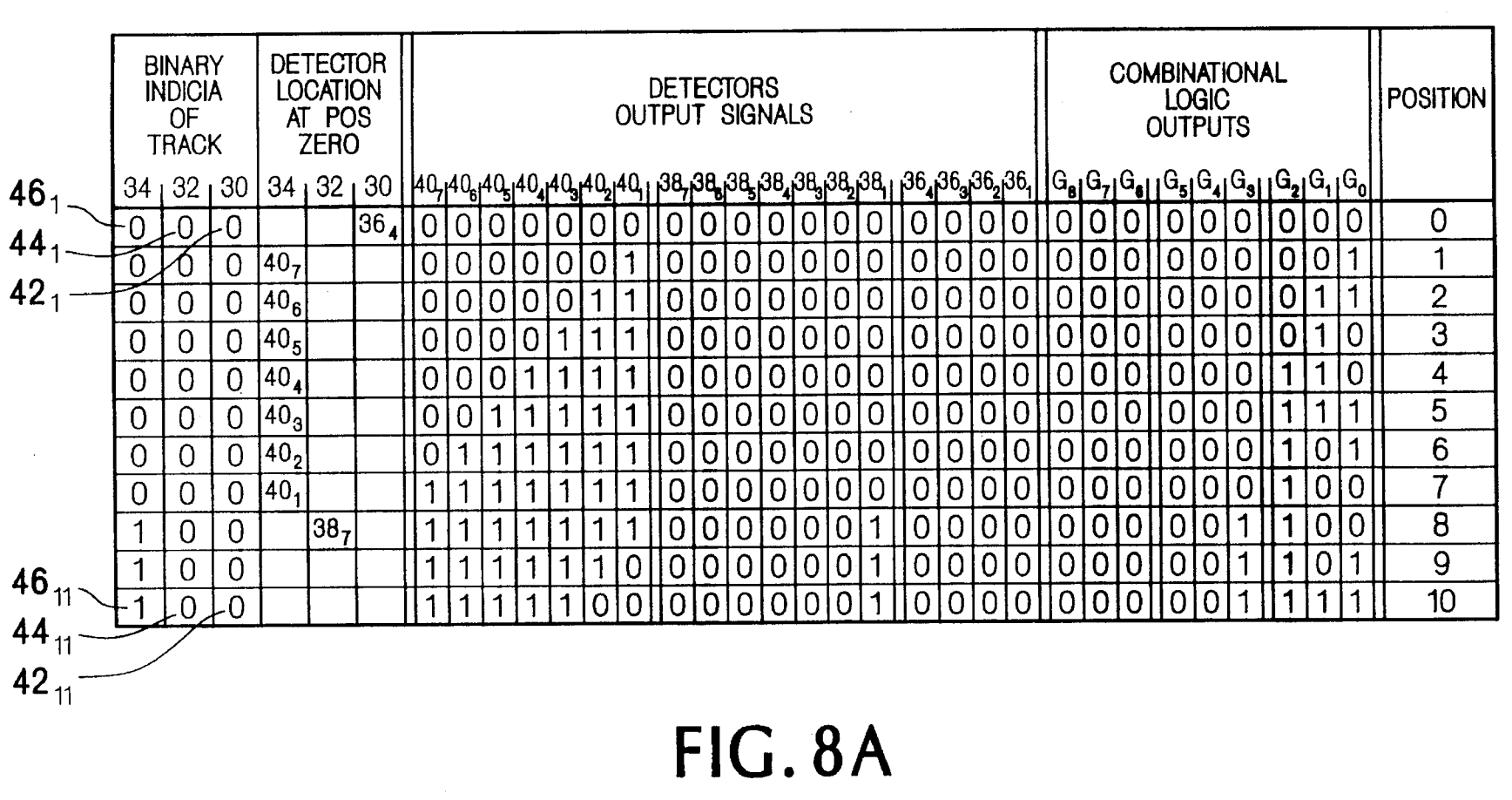
Figure 8B:
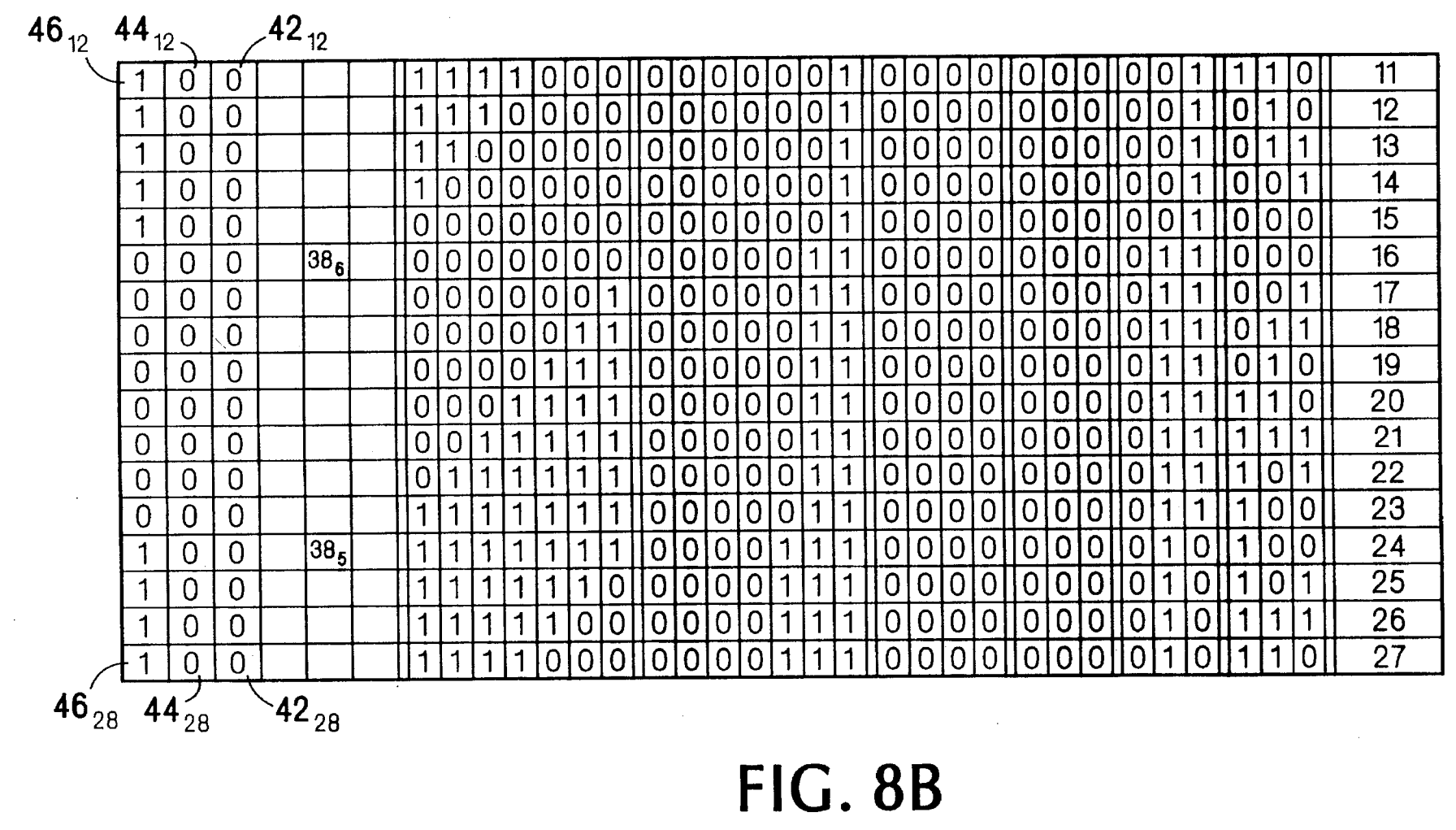
Figure 8C:
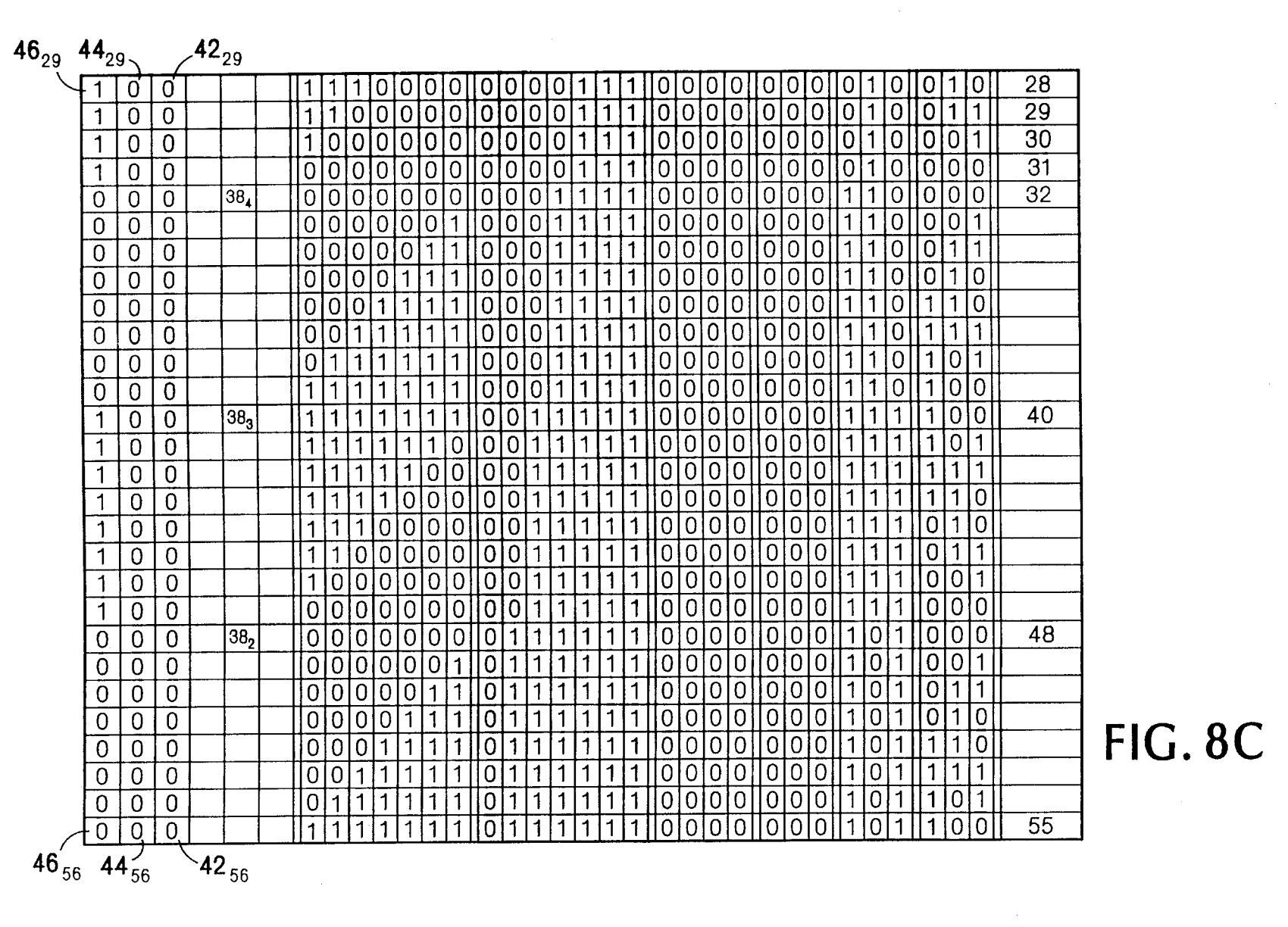
Figure 8D:
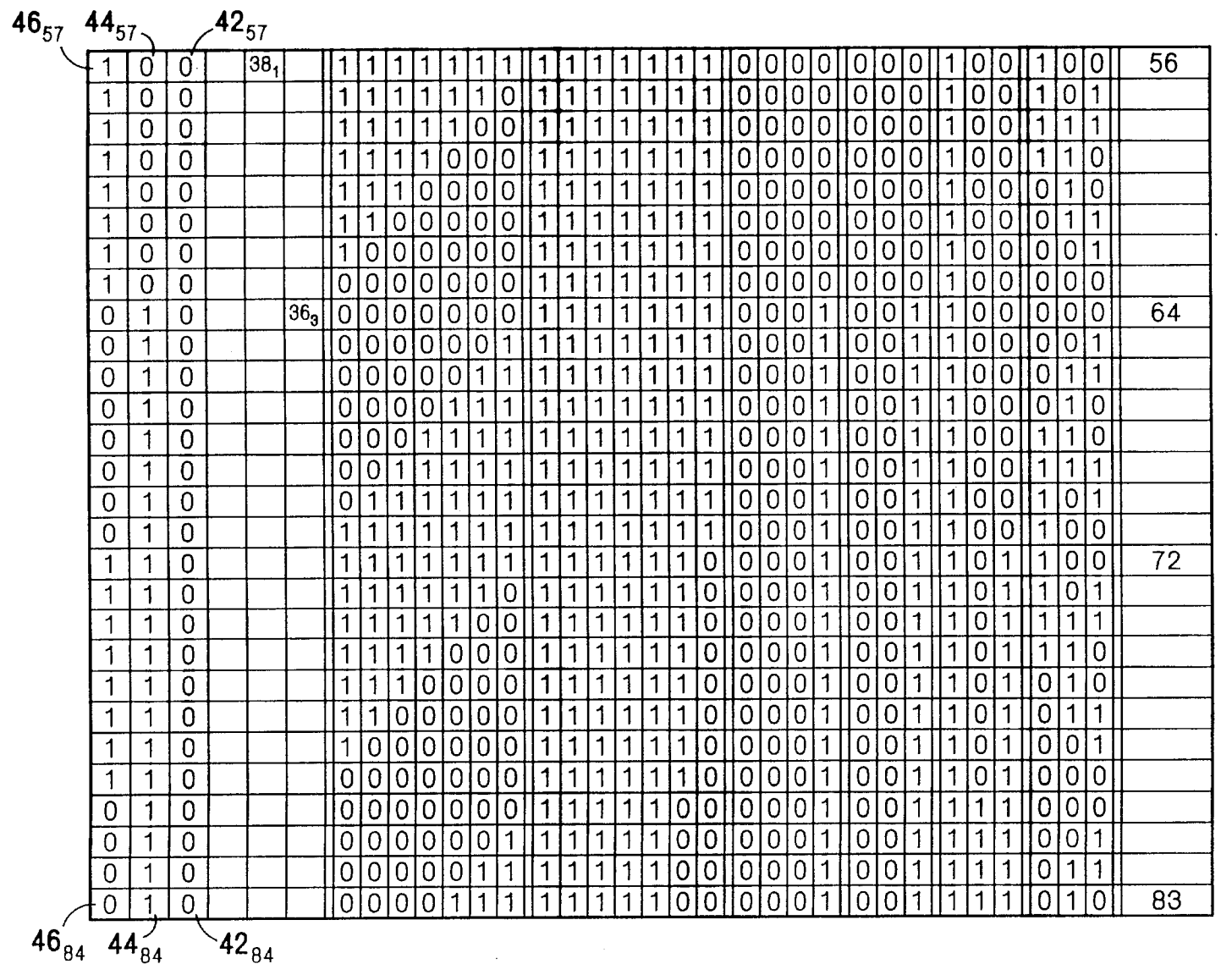
Figure 8E:
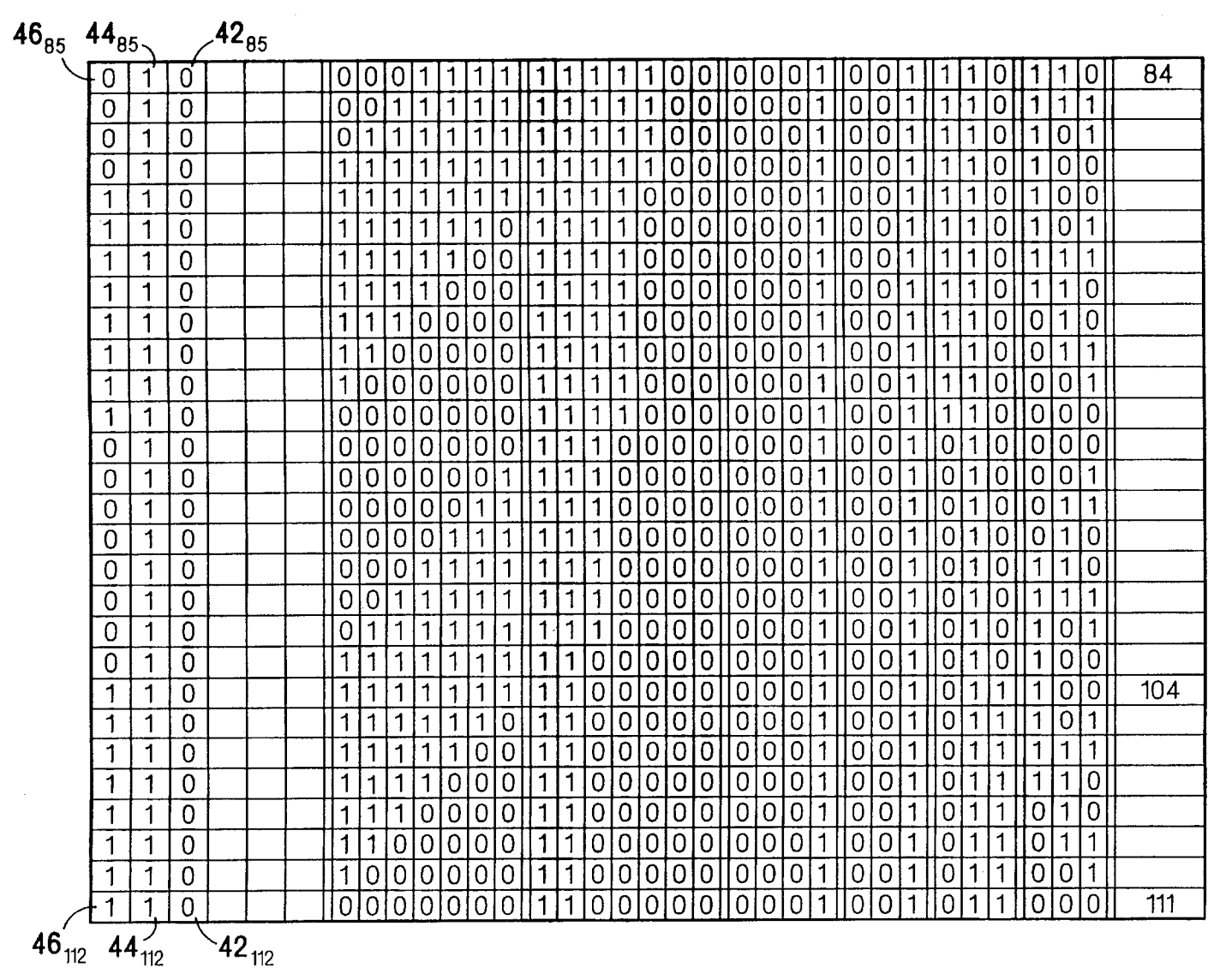
Figure 8F:
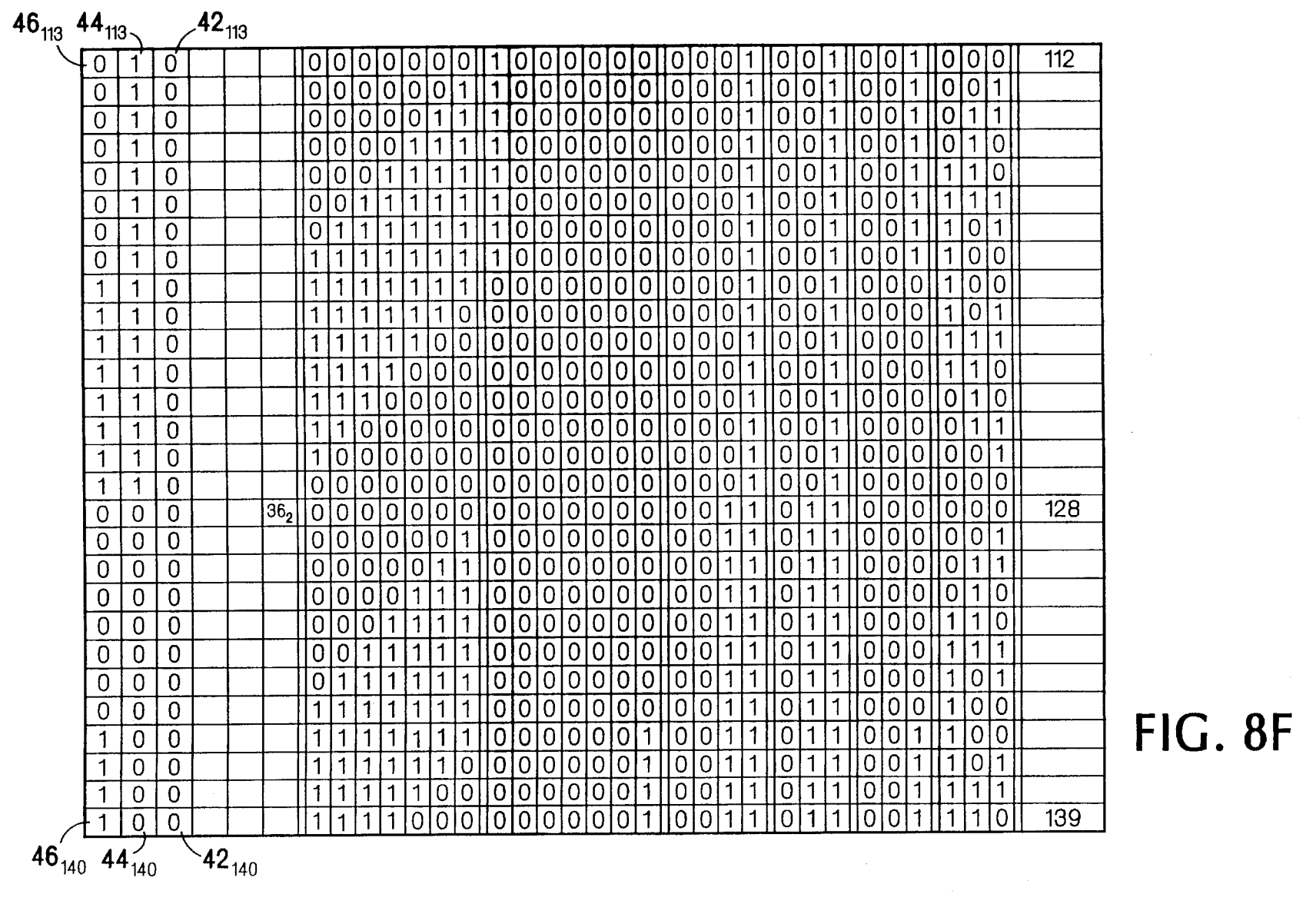
Figure 8G:
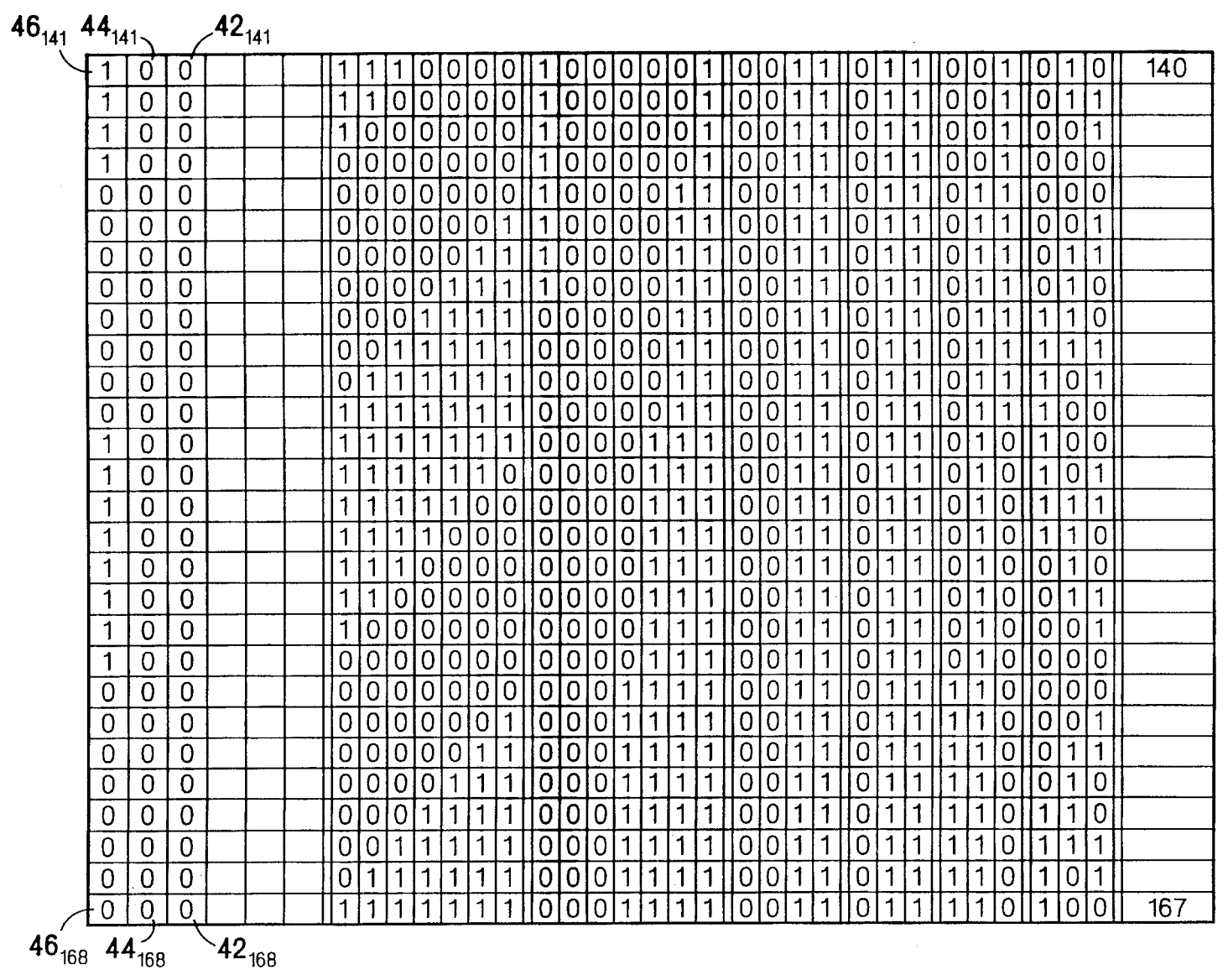
Figure 8H:
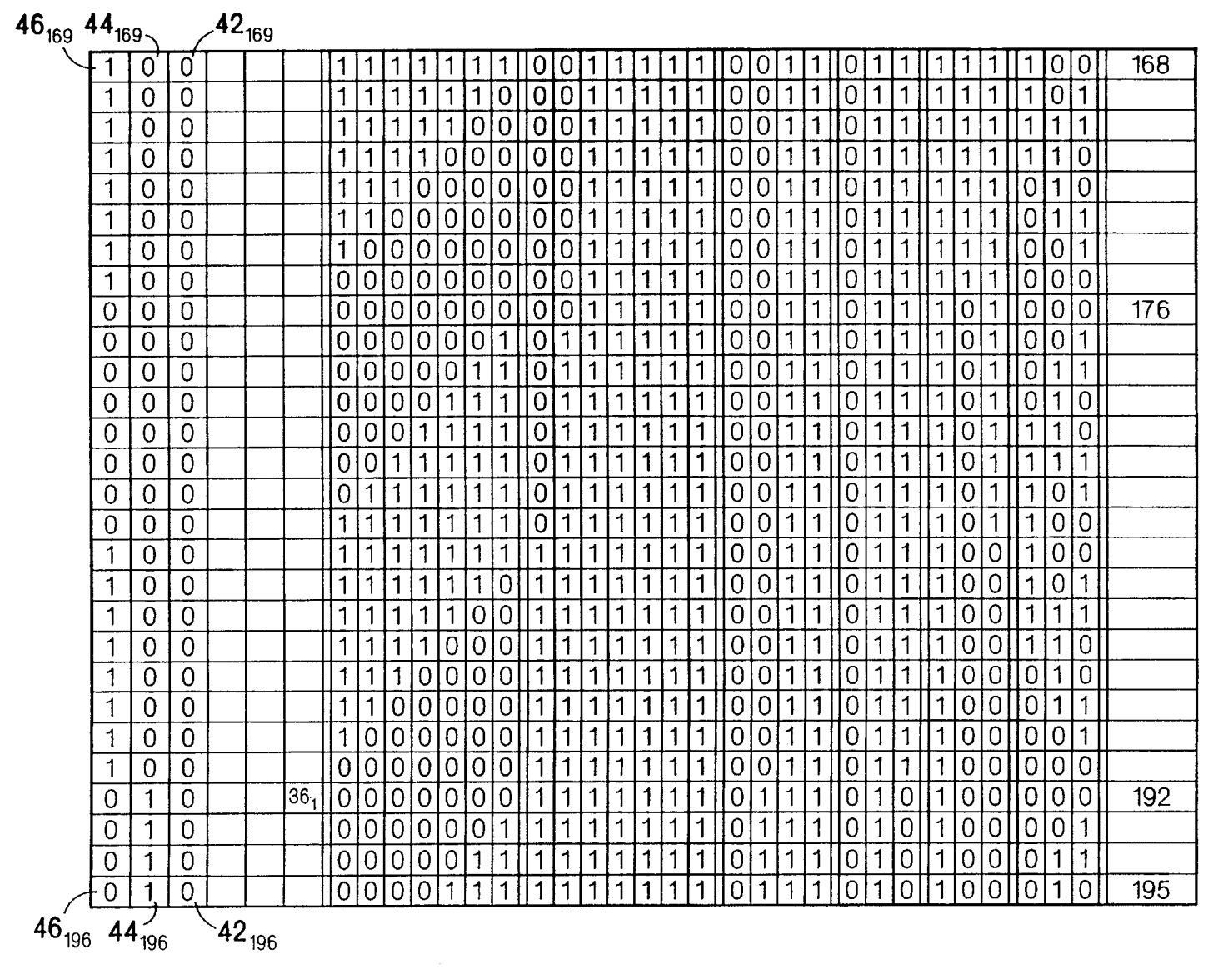
Figure 8J:
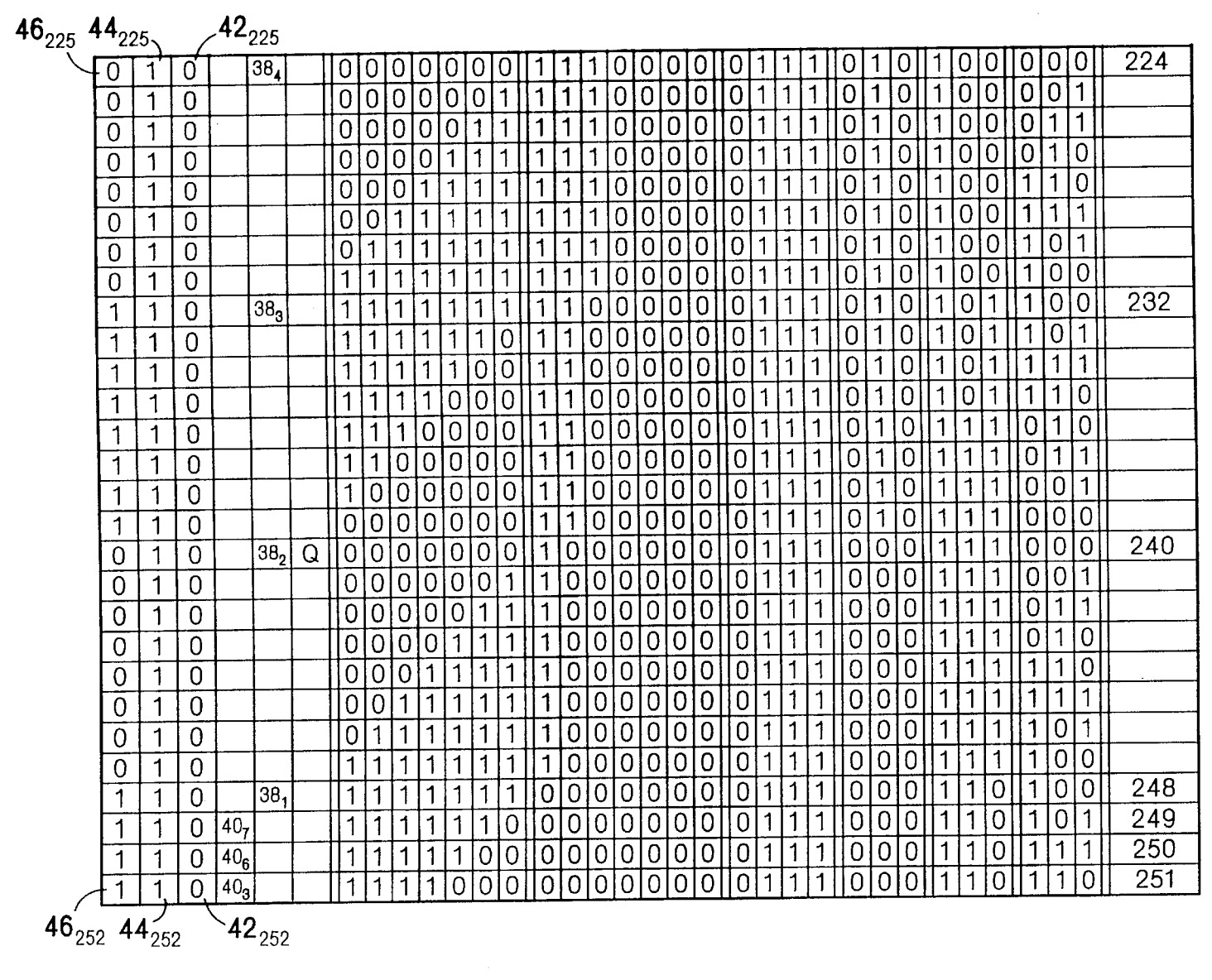
Figure 8K:
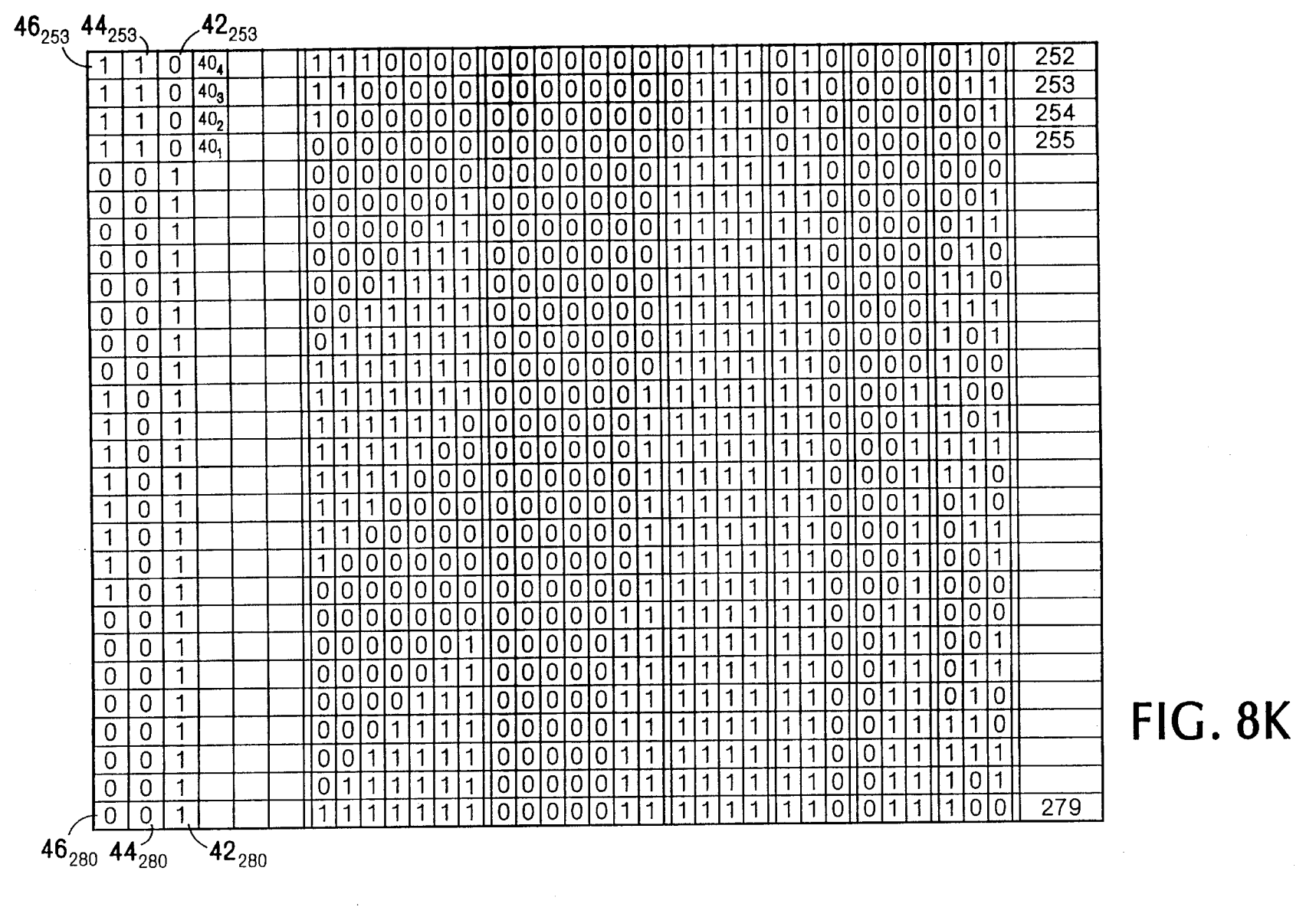
Figure 8L:
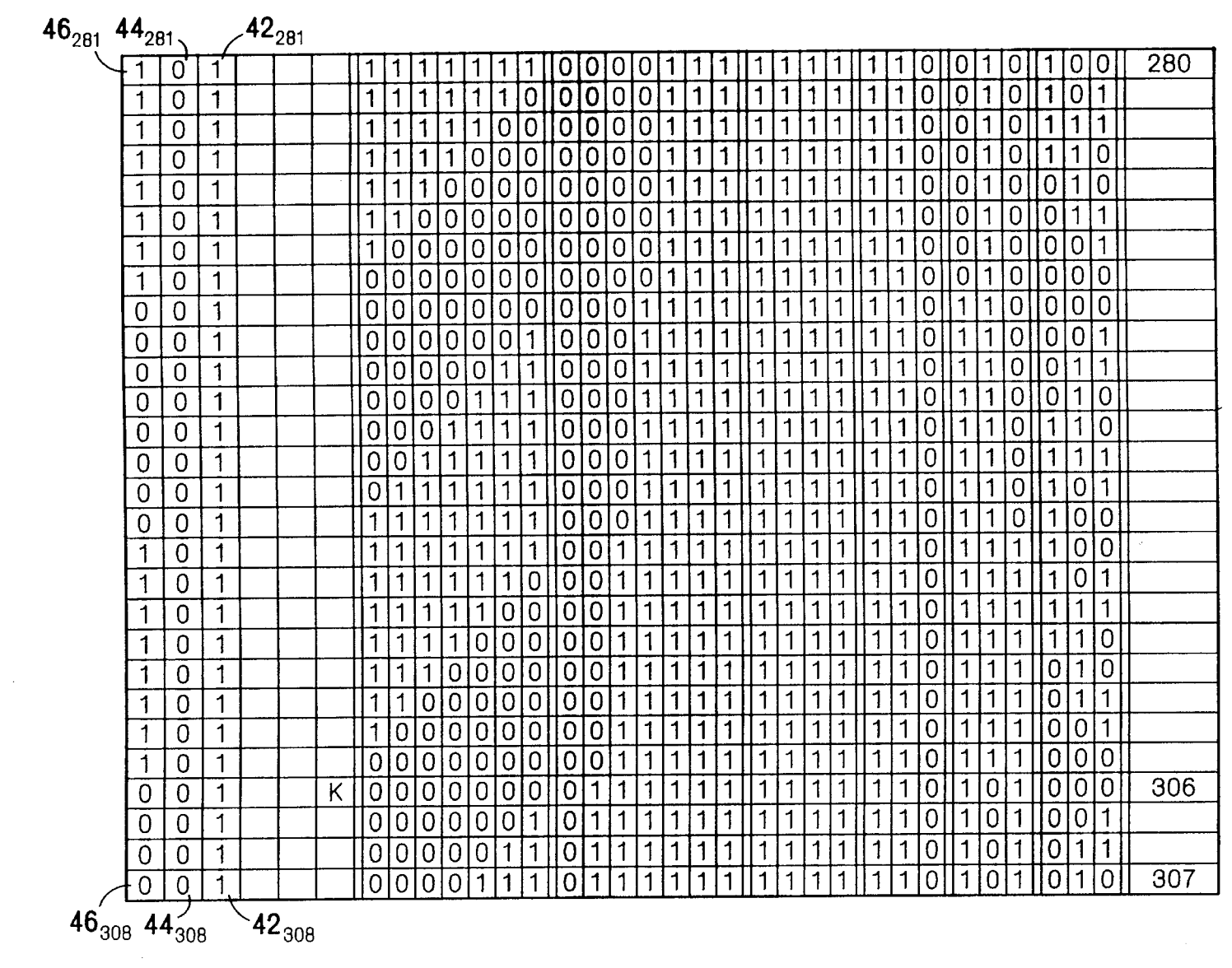
Figure 8M:
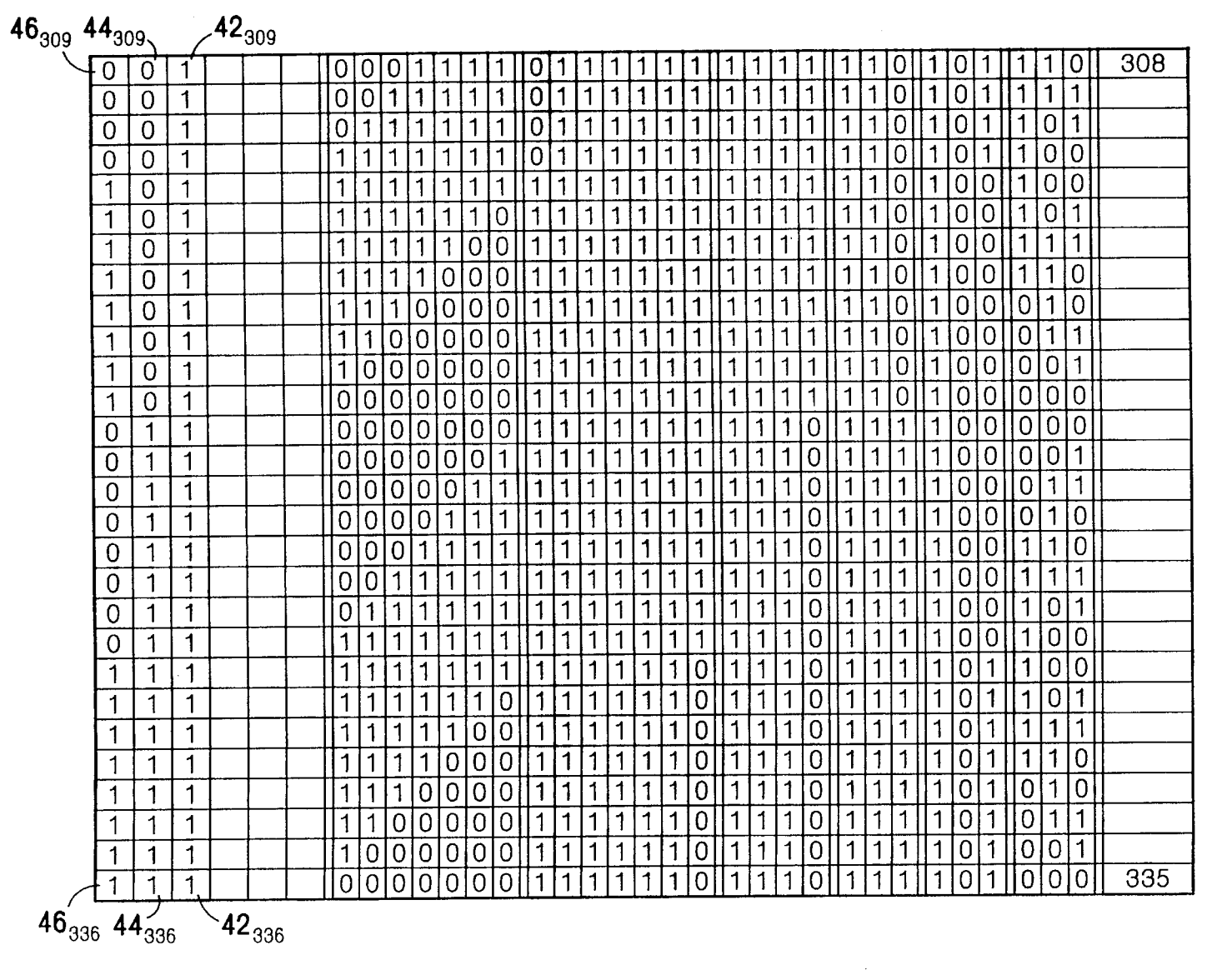
Figure 8N:
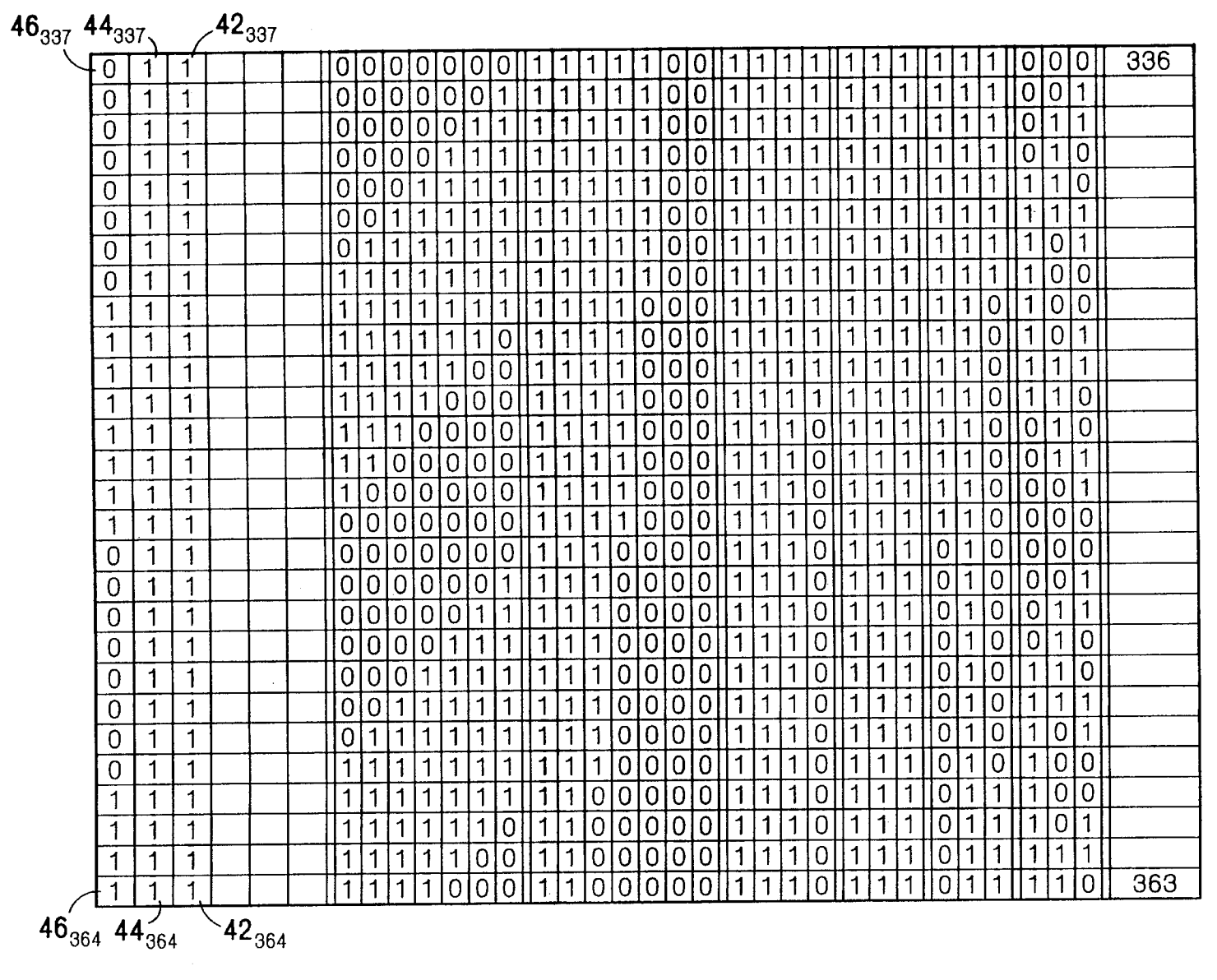
Figure 8P:
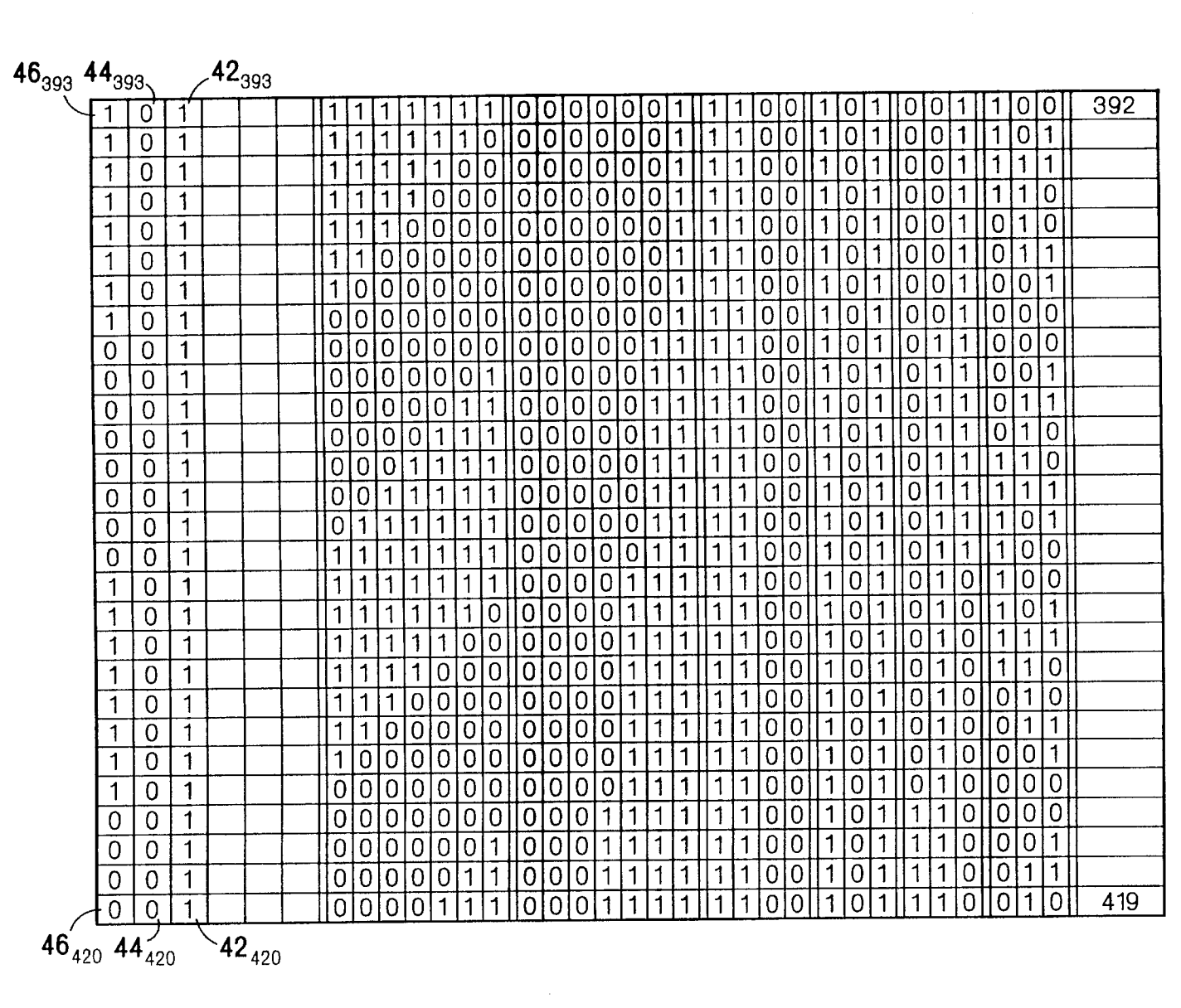
Figure 8Q:
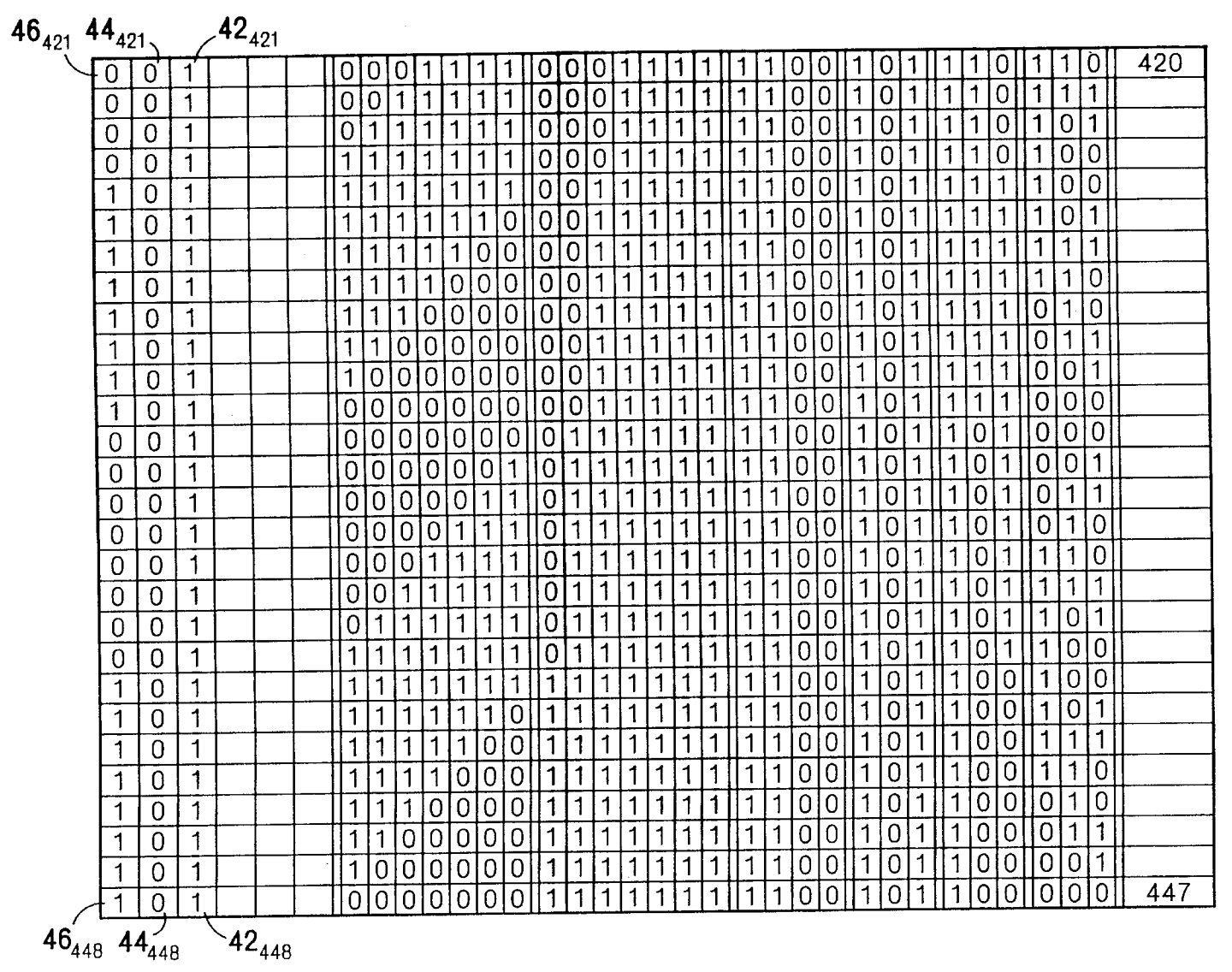
Figure 8R:
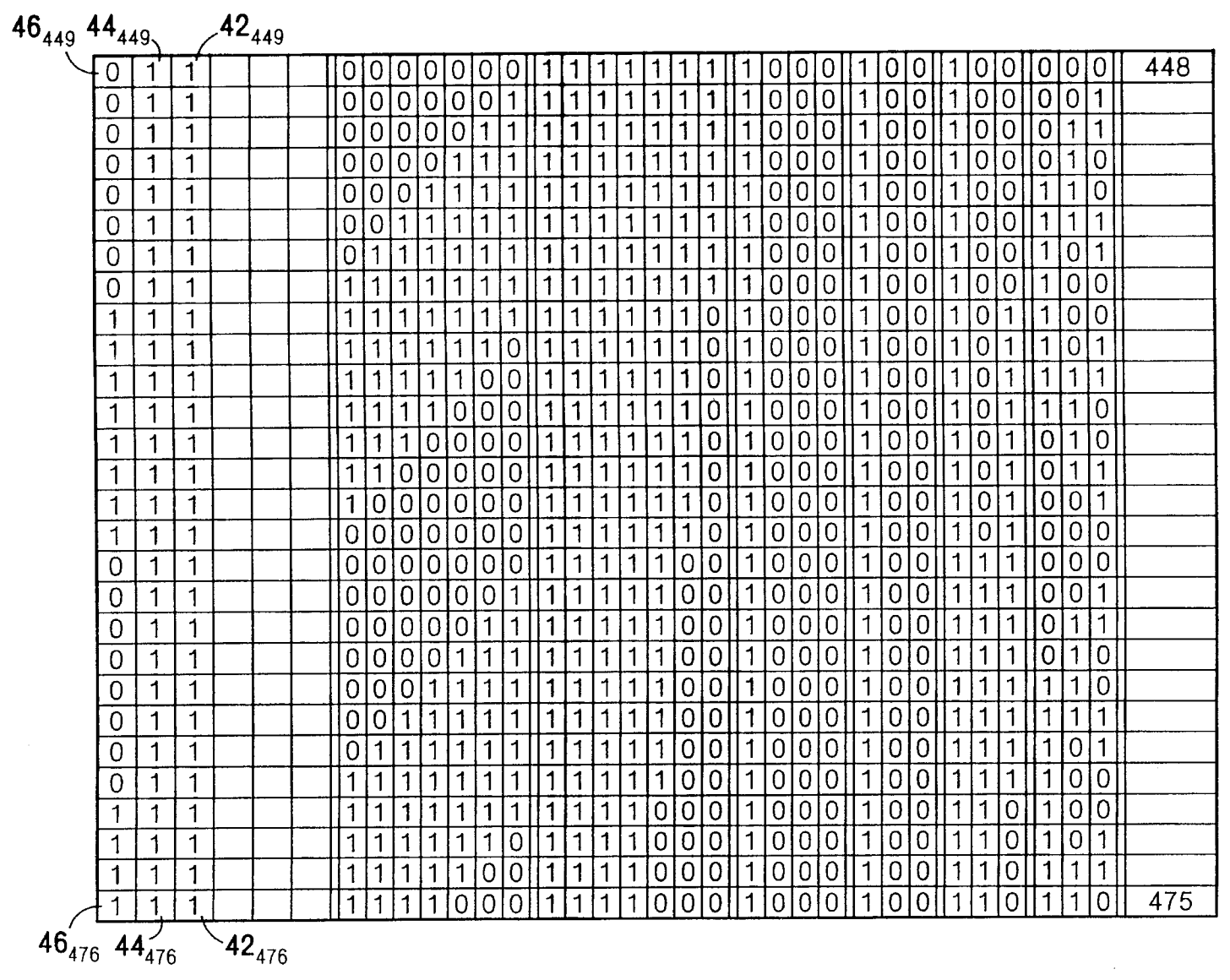
Figure 8S:
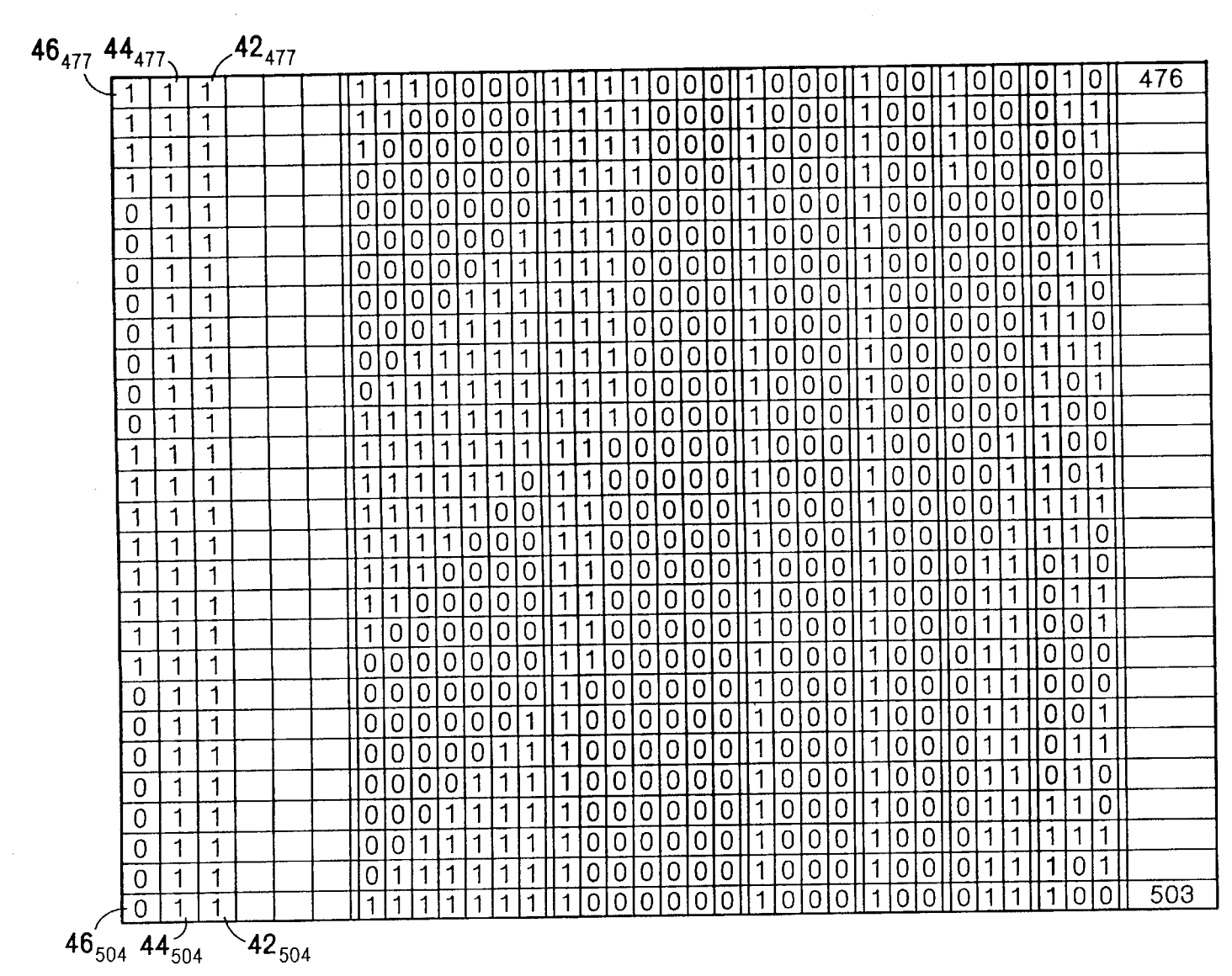

FIG. 8A through FIG. 8T, together, in the arrangement shown in FIG. 8, is a truth table for the encoder of FIG. 7; and FIG. 9 is a cross-sectional view of a linear actuator having the encoder of FIG. 7.

Figure 2:
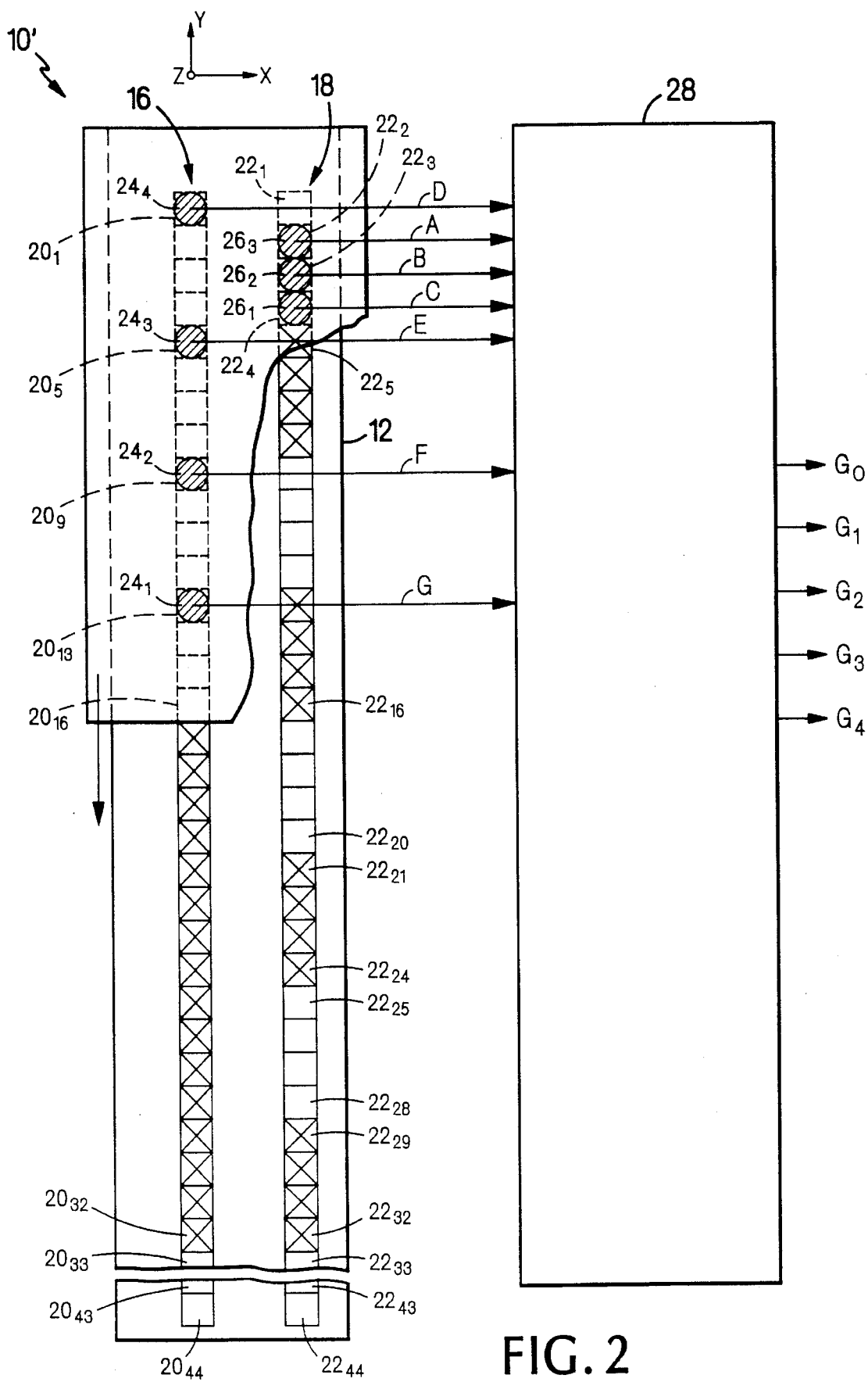
FIG. 2 is a diagrammatical sketch showing the relationship of a binary indicia code used on one member of the encoder of FIG. 1 and detectors used on another partially cutaway member at one relative position of the members.

Referring now to FIGS. 1 and 2, an encoder 10 is shown for determining absolute position of a first member 12 with respect to a second member 14. The absolute position is determined to within a resolution cell of $L/2^n$, where n is an integer and L is a predetermined span, here a linear length. It should be understood, however, that the span may be a circular or arcuate span, in which case L would be in angular measure.

The first member 12 of the encoder 10 has a plurality of, m, (here m=2) tracks 16, 18 of binary state indicia $20_1$–$20_{44}$, and $22_1$–$22_{44}$, respectively, disposed in a predetermined pattern on the first member 12. Here, the binary indicia $20_1$–$20_{16}$ of track 16 represents logical 0 state, binary indicia $20_{17}$–$20_{32}$ of such track 16 represent a logical 1 state, and binary indicia $20_{33}$–$20_{44}$ represent a logical 0 state. (It should be noted that the binary indicia which represent the logical i state have been indicated in the drawing with an "x" for convenience in understanding the invention, i.e., for ease in reading; it being understood that the "x" does not actually appear on the encoder). Here, binary indicia $22_1$–$22_4$, $22_9$–$22_{12}$, $22_{17}$–$22_{20}$, $22_{25}$–$22_{28}$, $22_{33}$–$22_{36}$, $22_{41}$–$22_{44}$ of track 18 represent a logical 0 state, and binary indicia $22_5$–$22_8$, $22_{13}$–$22_{16}$, $22_{21}$–$22_{24}$, $22_{29}$–$22_{32}$, $22_{37}$–$22_{40}$ of such track 18 represent a logical 1 state.

The binary indicia $20_1$–$20_{32}$, and $22_1$–$22_{32}$ are distributed over the predetermined span, L, of, the first member 12. Here the length L is divided into 32 segments, or resolution cells. Thus, here n is equal to 5 (i.e $2^5$=32) and 32 different positions are detectable; here, position 0 to position 31. If a natural binary or Gray code were used as described above, the number of tracks, m, would be equal to n. That is, the first member 12 would have 5 tracks. Here, however, m is an integer less than n. Thus, here the encoder 10 may be smaller in size than the above described natural or Gray code encoders.

Figure 2A:
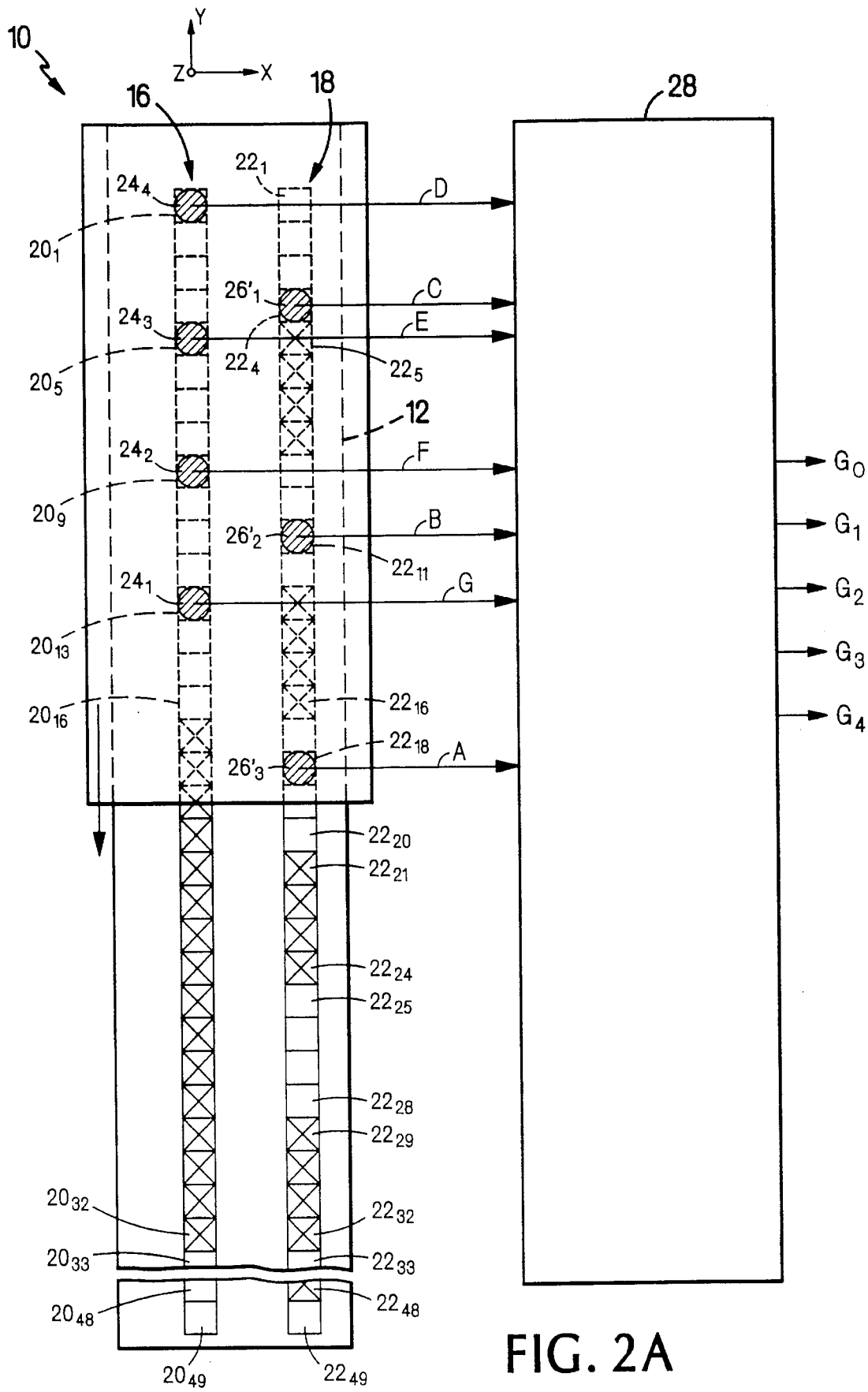
FIG. 2A is a diagrammatical sketch of another embodiment of an encoder according to the invention.

The second member 14 has disposed thereon a plurality of, m, (here 2) sets 23, 25 of binary state detectors $24_1$–$24_4$, $26_1$–$26_3$, respectively, as shown. Each one of the sets 23, 25 of detectors $24_1$–$24_4$, $26_1$–$26_3$ being adapted to detect the binary indicia in a corresponding one of the m tracks, 16, 18, respectively, as shown. Thus, here the first set 23 of detectors $24_1$–$24_4$ is disposed in vertical alignment, or registration with, track 16, and the second set 25 of detectors $26_1$–$26_3$ is disposed in vertical alignment, or registration with, track 18. The detectors $24_1$–$24_4$, $26_1$–$26_3$ are disposed on the second member 14 at predetermined positions thereof to detect a portion of the binary state indicia in predetermined orientation with such detectors. Thus, here the first and second members 12, 14 are disposed in the X-Y plane, displaced from one another by a suitable distance along the Z-axis by a suitable bearing, not shown, and are adapted for relative movement along the Y axis by means of such bearing, not shown. When the first and second members 12, 14 are in the position shown in FIG. 1, detectors $24_4$–$24_1$ and $26_3$–$26_1$ are disposed over, i.e., in vertical registration with, binary indicia $20_{19}$, $20_{23}$, $20_{27}$, $20_{31}$, $22_{20}$, $22_{21}$, $22_{22}$, as shown. It should also be noted that both sets 23, 25 of binary state detectors $24_1$–$24_4$, $26_1$–$26_3$ include more than one detector disposed for detecting the binary indicia in each one of the tracks 16, 18. Further, the pattern of binary indicia of the first one of the m tracks, here track 16, comprises a set of consecutive binary indicia, here binary indicia $20$–$20_{16}$, represent a first logic state, here logical state 0. A succeeding, second set of binary indicia, here binary indicia $20_{17}$–$20_{32}$, represent the complement of the first logic state, i.e., binary indicia $20_{17}$–$20_{32}$ represent the logic state 1. The pattern of binary indicia of a second one of the m tracks, here track 18, comprises a first set of consecutive binary indicia, here binary indicia $22_1$–$22_4$, representing a first logic state, here logical state 0; a succeeding, second set, here binary indicia $22_5$–$22_8$, representing the complementary logical state, here logical state 1; a succeeding, third set, here binary indicia $22_9$–$22_{12}$, representing the first logic state, here logical state 0; and so forth along the track 18. The first and third sets of the binary indicia $22_1$–$22_4$ and $22_9$–$22_{12}$, respectively, of the second track 18 have a center-to-center separation of s resolution cells, here four cells. The detectors $24_1$–$24_4$ used to detect the binary states of binary indicia of the first track 16 also have a separation of s cells, here four cells. The detectors $26_1$–$26_3$ used to detect the binary indicia in the second track 18 are adjacent one another (i.e., have a center-to-center separation of one resolution cell) and are therefore disposed for detecting adjacent ones of the binary indicia in the second track 18. Alternatively, they may be separated by the absolute magnitude of ps-1, where p is an even integer. (Here, 0 is considered an even integer.) Thus, for example while FIG. 2 shows an encoder 10 in position 0 with the detectors $26_1$–$26_3$ contiguous one another, i.e., p=0 and the detectors $26_1$–$26_3$ have a center-to-center separation of 1 resolution cell. In position 0, detectors $26_1$, $26_2$, and $22_3$ are disposed over binary indicia $22_4$, $22_3$, and $22_2$, respectively, as shown. FIG. 2A shows an encoder where the center-to-center separation between detectors $26'_1$–$26'_3$ is seven resolution cells; i.e., p=2 (ps-1=7, where as noted above s=4). In such case, tracks 16 and 18 are extended by five binary indicia $20_{45}$–$20_{49}$, $22_{45}$–$22_{49}$, respectively, as shown in FIG. 2A. Binary indicia $22_{33}$–$22_{36}$, and binary indicia $22_{41}$–$22_{44}$, represent a logical 0, binary indicia $22_{37}$–$22_{40}$ represent a logical 1 state. Added binary indicia $22_{45}$–$22_{48}$ represent a logical 1 state and binary indicia $20_{45}$–$20_{49}$, $22_{49}$ represent a logical 0 state. Also, in position 0 shown in FIG. 2A detector $26'_1$ is disposed over binary indicia $22_4$, detector $26'_2$ is disposed over binary indicia $22_{11}$ and detector $26'_3$ is disposed over binary indicia $22_{18}$, as shown. Alternatively, the center-to-center separation between adjacently ordered (i.e., successively positioned) detectors may be ps+1. In such case, with s=4 and p=2, the detectors $26'_1$, $26'_2$, $26'_3$ are separated by 9 binary indicia; and, in position 0, detectors $26'_1$, $26'_2$, and $26'_3$ are disposed over binary indicia $22_{20}$, $22_{11}$ and $22_2$, respectively.

Here, the binary indicia are represented by the magnetic state. The detectors are here conventional Hall effect cells. Thus, with a Hall effect cell, a voltage may be detected when such Hall effect cell detects a representative magnetic state. Binary indicia may be represented by other means representing two distinct states. For example, there may be optical, capacitive, resistive, inductive or other suitable representations. The output signals produced by the detectors $24_1$–$24_4$, $26_1$–$26_3$ are fed to a combinational logic section 28. The combinational logic section 28 includes a plurality of logic gates, not shown, to convert the signals produced by the detectors into an n=5 bit binary word signal $G_4G_3G_2G_1G_0$ representative of the absolute position of the one of the two members 12, 14 with respect to the other member that is a corresponding one of decimal numbers. That is, here the absolute position of member 12 with respect to member 14 as such members move one relative to the other along the Y axis. More particularly, the combinational logic section 28 here combines the logical signals produced by the detectors $24_1$–$24_4$, $26_1$–$26_3$ in accordance with the following equation:

$G_0 = A \oplus C$ $G_1 = B$ $G_2 = E \oplus G$ $G_3 = F$ $G_4 = D$ where:

A, B, C, D and E are the logic signals produced by detectors $26_3$, $26_2$, $26_1$, $24_4$, $24_3$, $24_2$, and $24_1$, respectively; the binary word signal produced by the combinational logic network 28 is $(G_4G_3G_2G_1G_0)2$, where $G_0$ is the least significant bit of the binary word signal; and $\oplus$ represents exclusive OR.

For purpose of explanation, it is assumed that the first member 12 is stationary and the second member 14 moves from left to right in FIG. 1, and the vertical alignment between the detectors and the binary indicia is that shown in FIG. 2, for an initial position 0, where the detectors are represented as cross-hatched circles and the binary indicia are represented as squares. That is, here the members 12, 14 are considered as being in the first position or resolution cell (i.e., position 0) of the 32 positions or resolution cells adapted for detection by the encoder 10. The following Table shows the logic signals produced by the detectors $26_3$–$26_1$, $24_4$–$24_1$ ("Detector Output Signals") for each of the 32 positions ("Position": 0–31) and the bits of the binary word signal, G4G3G2GiG0, produced by the combinational logic network 28 ("Comb. Log. Out") for each of the 32 positions thereby encoding decimal numbers corresponding to the 32 positions into corresponding binary word signals:

| | Detector Output Signal | | | | | | | Comb. Log. Out | | | | |
|---|---|---|---|---|---|---|---|---|---|---|---|---|
| | $26_3$ | $26_2$ | $26_1$ | $24_4$ | $24_3$ | $24_2$ | $24_1$ | | | | | |
| Pos. | A | B | C | D | E | F | G | $G_4$ | $G_3$ | $G_2$ | $G_1$ | $G_0$ |
| 0 | 0 | 0 | 0 | 0 | 0 | 0 | 0 | 0 | 0 | 0 | 0 | 0 |
| 1 | 0 | 0 | 1 | 0 | 0 | 0 | 0 | 0 | 0 | 0 | 0 | 1 |
| 2 | 0 | 1 | 1 | 0 | 0 | 0 | 0 | 0 | 0 | 0 | 1 | 1 |
| 3 | 1 | 1 | 1 | 0 | 0 | 0 | 0 | 0 | 0 | 0 | 1 | 0 |
| 4 | 1 | 1 | 1 | 0 | 0 | 1 | 0 | 0 | 0 | 1 | 1 | 0 |
| 5 | 1 | 1 | 0 | 0 | 0 | 1 | 0 | 0 | 0 | 1 | 1 | 1 |
| 6 | 1 | 0 | 0 | 0 | 0 | 1 | 0 | 0 | 0 | 1 | 0 | 1 |
| 7 | 0 | 0 | 0 | 0 | 0 | 1 | 0 | 0 | 0 | 1 | 0 | 0 |
| 8 | 0 | 0 | 0 | 0 | 1 | 1 | 0 | 1 | 1 | 0 | 0 | 0 |
| 9 | 0 | 0 | 1 | 0 | 1 | 1 | 0 | 1 | 1 | 0 | 0 | 1 |
| 10 | 0 | 1 | 1 | 0 | 1 | 1 | 0 | 1 | 1 | 1 | 1 | 1 |
| 11 | 1 | 1 | 1 | 0 | 1 | 1 | 0 | 1 | 1 | 1 | 1 | 0 |
| 12 | 1 | 1 | 0 | 1 | 1 | 1 | 0 | 1 | 0 | 1 | 0 | 1 |
| 13 | 1 | 1 | 0 | 1 | 1 | 1 | 0 | 1 | 0 | 1 | 1 | 1 |
| 14 | 1 | 0 | 0 | 1 | 1 | 1 | 0 | 1 | 0 | 0 | 0 | 1 |
| 15 | 0 | 0 | 0 | 1 | 1 | 1 | 0 | 1 | 0 | 0 | 0 | 0 |
| 16 | 0 | 0 | 0 | 1 | 1 | 1 | 1 | 1 | 0 | 0 | 0 | 0 |
| 17 | 0 | 0 | 1 | 1 | 1 | 1 | 1 | 1 | 1 | 0 | 0 | 1 |
| 18 | 0 | 1 | 1 | 1 | 1 | 1 | 1 | 1 | 1 | 0 | 1 | 1 |
| 19 | 1 | 1 | 1 | 1 | 1 | 1 | 1 | 1 | 1 | 0 | 1 | 0 |
| 20 | 1 | 1 | 1 | 1 | 1 | 0 | 1 | 1 | 1 | 1 | 1 | 0 |
| 21 | 1 | 1 | 0 | 1 | 1 | 0 | 1 | 1 | 1 | 1 | 1 | 1 |
| 22 | 1 | 0 | 0 | 1 | 1 | 0 | 1 | 1 | 1 | 1 | 0 | 1 |
| 23 | 0 | 0 | 0 | 1 | 1 | 1 | 0 | 1 | 1 | 1 | 0 | 0 |
| 24 | 0 | 0 | 0 | 1 | 1 | 0 | 0 | 1 | 0 | 1 | 0 | 0 |
| 25 | 0 | 0 | 1 | 1 | 1 | 0 | 0 | 1 | 0 | 1 | 0 | 1 |
| 26 | 0 | 1 | 1 | 1 | 1 | 0 | 0 | 1 | 0 | 1 | 1 | 1 |
| 27 | 1 | 1 | 1 | 1 | 1 | 0 | 0 | 1 | 0 | 1 | 1 | 0 |
| 28 | 1 | 1 | 1 | 1 | 0 | 0 | 0 | 1 | 0 | 0 | 1 | 0 |
| 29 | 1 | 1 | 0 | 1 | 0 | 0 | 0 | 1 | 0 | 0 | 1 | 1 |
| 30 | 1 | 0 | 0 | 1 | 0 | 0 | 0 | 1 | 0 | 0 | 0 | 1 |
| 31 | 0 | 0 | 0 | 1 | 0 | 0 | 0 | 1 | 0 | 0 | 0 | 0 |

The output binary word signal is a "cyclic", "unit-distance-code", here in Gray code format. The truth table for encoder 10 is shown in FIGS. 3, 3A and 3B. It is first noted that the detectors $26_3, 26_2, 26_1, 24_4, 24_3, 24_2, 24_1$ produce a seven bit digital word signals ABCDEFG. It is next noted that only one bit in such word signals ABCDEFG changes from one position to the next position. Further, in going from position 31 to position 0 only one bit changes. Thus, the digital word signals produced by detectors $26_3, 26_2, 26_1, 24_4, 24_3, 24_2, 24_1$ is a "cyclic" "unit-distance-code" Further, it should be noted that only n=5 bits are required for the $2^n$ (i.e. 32) positions and the ABCDEFG digital word signals produced by detectors $26_3, 26_2, 26_1, 24_4, 24_3, 24_2, 24_1$ is an $2^n$ bit digital word signals (i.e., q=7>n=5). Thus, the digital word signal produced by detectors $26_3, 26_2, 26_1, 24_4, 24_3, 24_2, 24_1$ is an "excess binary code" a digital word signal, or code, having more than are required for the 32 positions, that is q>n). Finally, it should be noted that the q bit digital word signals, or code, produced by the detectors $26_3, 26_2, 26_1, 24_4, 24_3, 24_2, 24_1$ is decoded by the combinational logic section 28 into a n=5 bit Gray code format, as noted above.

Referring now to FIGS. 4A–4C, the difference between 32 position absolute encoders is evident: an absolute position encoder using a conventional, natural binary code according to the prior art is shown in FIG. 4A, such encoder showing 5 detectors ABCDE for producing an n=5 bit digital word signal from m=n=5 tracks of binary indicia disposed in the zero position; an absolute position encoder using a conventional, Gray code according to the prior art is shown in FIG. 4B, such encoder showing 5 detectors ABCDE for producing an n=5 bit digital word signal from m=n=5 tracks of binary indicia disposed in the zero position; and, the absolute position encoder 10 according to the invention is shown in FIG. 4C, such encoder showing 7 detectors ABC- DEFG for producing a q=7 bit digital word signal, where q>n from m=2<n=5 tracks of binary indicia disposed in the zero position. It is first noted that each of the three encoders produces, after combinational logic processes signals ABCDE, from the encoders in FIGS. 4A and 4B and the signals ABCDEFG from the encoder in FIG. 4C, the same Gray code signal $G_4G_3G_2G_1G_0$ in accordance with the logic equations shown aside the encoder. Finally, it should be noted that the number of tracks according to the invention has been reduced in comparison to the prior art; i.e., from five tracks to two tracks. Next the number of logic transitions has been reduced with the invention; i.e., with the natural binary code (FIG. 4A) detector A experiences a transition at each position and with the Gray code (FIG. 4B), detector A experiences a transition every two positions. With the present invention (FIG. 4C), detectors A, B, or C (i.e., detectors 263, 262, 261 experience a transition only every four positions.

Referring now to FIG. 5, an encoder 10' is shown with a vernier for resolving each one of the 32 main resolution cells into a plurality of sub-cells. Here, each one of the 32 main cells is resolved into $2^{11}$=2048 sub-cells of resolution. Thus, the first member 12' has, in addition to tracks 16, 18 of binary indicia $20_1$–$20_{44}$, and $22_1$–$22_{44}$, described above in connection with encoder 10, an additional, third track 60, of binary indicia, as shown. Track 60 includes a series of alternating opaque and transparent binary indicia $60_1$–$60_{65,536}$ positioned aside of track 18, as shown, along the predetermined span, L, described above in connection with encoder 10, FIG. 1; that is along the 32 positions to be detected. Thus, binary indicia $60_1$, $60_3$, $60_5$, $60_7$, . . . $60_{65,535}$ (i.e., the indicia having an odd numbered subscript notion) are, here, opaque and represent a logical 0; while indicia $60_2$, $60_4$, $60_6$ . . . $60_{65,536}$ (i.e., the indicia having an even numbered subscript notion) are, here, transparent and represent a logical 1. The second member 14', which is disposed above member 12' as shown and described above in connection with FIGS. 1 and 2, has, in addition to detectors $24_1$–$24_4$ and $26_1$–$26_3$, a pair of light detectors $65_1$, $65_2$ disposed above the third track 60 of binary indicia $60_1$–$60_{65,536}$ for detecting the logic state of the underlying binary indicia. The encoder 10' is represented in FIG. 5 as being in the zero position, as described above in connection with encoder 10 (FIG. 1). A light source, not shown, is mechanically connected to member 14' and is disposed beneath the binary indicia $60_1$–$60_{65,536}$ in a conventional manner so that the detectors $65_1$, $65_2$ can detect the logic state represented by the binary indicia $60_1$–$60_{65,536}$. Referring also to FIG. 5A, in the zero position, detector $65_1$ is disposed above the entire lower half of binary indicia $60_1$ while the left half of detector $65_2$ is above the right half of the upper half of binary indicia $60_1$ and the right half of detector $65_2$ is disposed above the left half of the upper half of binary indicia $60_2$. Thus, the detectors $65_1$, $65_2$ are disposed in conventional spatial quadrature with the binary indicia $60_1$–$60_{65,536}$. Thus, the binary indicia $60_1$–$60_{65,536}$ along with the pair of detectors $65_1$, $65_2$ provide a conventional quadrature incremental encoder 63 (FIG. 6).

The outputs $G_0$–$G_4$ of the combinational logic section 28 are fed, along with the outputs from detectors $65_{65}$–$65_2$ to a processor 68. More particularly, the outputs from detectors $65_1$, $65_2$ are fed to processor 68 via lines $70_1$, $70_2$, respectively, as shown. Referring also to FIG. 6, the processor 68 is shown to include an absolute position encoder cell transition detector, 75, here an Intel microprocessor, for detecting when one of the absolute position of the main, 32 resolution cells has increased, or decreased by one. That is, the seven bit digital word signal ABCDEFG, described above in connection with FIG. 1, provides an indication of absolute position in one of 32 main positions. When the position of member 12' changes from member 14' by one of the 32 resolution cells, a detection signal is produced by absolute position encoder transition detector 75 on either line $75_1$ or $75_2$. A signal is produced on line $75_1$ when detector 75 detects that the main position has increased from its previous position; and, a signal is produced on line $75_2$ when detector 75 indicates that the main position has decreased in position. That is, for example, assume that the detectors $22_1$–$22_3$, $24_1$–$24_4$ produce signals ABCDEFG indicating an absolute position of 10. Let it be assumed that member 14' moves, here to the right, so that the detectors $22_1$–$22_3$, $24_1$–$24_4$ produce signals ABCDEFG indicating an absolute position of 11. In such case a signal is produced on line $75_1$. If, on the other hand, member 14' moved, here to the left, so that the detectors $22_1$–$22_3$, $24_1$–$24_4$ produce signals ABCDEFG indicating an absolute position of 9, in such case a signal is produced on line 752. The signal produced on lines $75_1$, $75_2$ are fed to the "clear" and "set" inputs, respectively, of up-down counter 77'. Here, up-down counter 77' is an eleven bit counter. Thus, up-down counter 77' produces as the contents thereof an eleven bit digital word signal and has 11 output lines, one for each bit of its contents to produce an eleven bit digital word signal $B_0$–$B_{10}$, where $B_0$ is the least significant bit (LSB) and $B_{10}$ is the most significant bit (MSB). Also fed to the decoder/up-down counter 77 are the signals produced by detectors $65_1$, $65_2$ via lines $70_1$, $70_2$, respectively, as shown. As the members 12', 14' move one with respect to the other pulses from detectors $65_1$, $65_2$ on each of lines $70_1$, $70_2$ as such detectors pass over the binary indicia $60_1$–$60_{65,536}$ in registration therewith. The decoder/up-down counter 77 counts up, or down, the number of pulses produced by the detectors on line $70_1$, $70_2$. More particularly, when the member 14' moves to the right, as shown in FIG. 5, the signal on line $70_2$ from detector $65_2$, FIG. 5A, leads the signal on line $70_1$, as shown in FIG. 6. In such case, the signal on line $70_1$ is a logical 0 when the signal on line $70_2$ rises from a logical 0 to a logical 1. Line $70_1$ is fed to a non-inverted input of AND gate A and an inverted input of AND gate B. Line $70_2$ is fed to an inverted input of AND gate A and a non-inverted input of AND gate B. The output of AND gate A feeds a rising edge triggered monostable multivibrator A and the output of AND gate B feeds a rising edge triggered monostable multivibrator B. Therefore, the monostable B produces a count-up signal to the up-down when the signal on line $70_2$ leads the signal on line $70_1$ (i.e., the member 14' moves toward the right end of member 12' FIG. and, on the other hand, the monostable A produces a count-down signal to the up-down when the signal on line $70_1$ leads the signal on line $70_2$ (i.e., the member 14' moves toward the left end of member 12'). Further, when a signal is produced on line $75_1$, all 11 bits of the contents in counter 77 are cleared to logical 0; when a signal is produced on line $75_2$ all 11 bits of the contents of counter are set to a logical 1.

It follows then, that, when, in the example above, member 14' moves, here to the right from main resolution cell 10 to main resolution cell 11, the detectors $22_1$–$22_3$, $24_1$–$24_4$ produce signals ABCDEFG indicating an absolute position of 11 (an increase in position from position 10); the signal produced on line $75_1$ clears the contents of decoder/counter 77, $B_0$–$B_{10}$, to logical 0. Therefore, as member 14' continues to move further to the right, pulses are produced on lines $70_1$, $70_2$ as the detectors $65_1$, $65_2$ pass over the binary indicia along side of binary indicia $22_{11}$ (FIG. 5) are counted up by the up-down 77' (i.e., the contents of up-down counter 77' increment by one in response to each pulse). The counted pulses (i.e., the contents of up-down counter 77') thereby indicate, to within a resolution of $20_{48}$ sub-resolution cells, the position of member 12' relative to member 14' from main resolution cell 11; that is, the up-down counter 77' provides an indication of how far member 14' has moved to the right of main position cell 11.

The contents of up-down counter 77' provide the 11 least significant bits of the digital word signal produced by processor 68, i.e., bits $B_0$–$B_{10}$, as indicated. The signals on lines $G_0$–$G_4$ are converted from Gray code to binary code in Gray code to binary code converter 79 to provide the five most significant bits $B_{11}$–$B_{15}$, i.e., the main scale of the determined position, as indicated. Thus, processor 68 produces a 16 bit digital word signal $B_{15}$–$B_0$; where $B_{15}$ is the MSB and $B_0$ is the LSB. The digital word signal represented by $B_{15}$–$B_0$ is greater than 10; indicating that the position of member 12' relative to member 14' is greater, or beyond, main position 10. (It should be noted that while the five MSBs provide an indication of the absolute position of one member 12' to member 14' the 11 LSBs provide an indication of how far one of the members 12', 14' has moved relative to the other member after a cell transition has been detected by the detector 75. That is, the vernier is provided by a relative, or incremental position encoder).

As the member 14' continues to move to the right so far that it reaches main resolution cell 12, a signal is produced on line $75_1$ again to clear the contents of up-down counter 77' to logical 0 and the process is repeated.

Likewise, when, in the example above, member 14' moves, here to the left from main resolution cell 10 to main resolution cell 9, the detectors $22_1$–$22_3$, $24_1$–$24_4$ produce signals ABCDEFG indicating an absolute position of 9 (a decrease in position from position 10 to position 9); the signal produced on line $75_2$ sets the contents of up/down counter 77', $B_0$–$B_{10}$, to logical i Therefore, as member 14' continues to move further to the left, pulses are produced on lines $70_1$, $70_2$ as the detectors $65_1$, $65_2$ pass over the binary indicia along side of binary indicia $22_{11}$ (FIG. 5). The up-down counter 77' counts down from its maximum count (i.e. represented by its 11 bit contents having been set to logical 1), so that such pulses thereby indicate, to within a resolution of $20_{48}$ sub-resolution cells, the position of member 12' relative to member 14' from main resolution cell 11; that is, the up-down counter 77' provides an indication of how far member 14' has moved to the left of main position cell 9.

As noted above, the contents of up-down counter 77' provide the 11 least significant bits of the digital word signal produced by processor 68, i.e., bits $B_0$–$B_{10}$, as indicated. The signals on lines $G_0$–$G_4$ after being converted in converter 79 to provide the five most significant bits $B_{11}$–$B_{15}$, as indicated. Thus, processor 68 (FIG. 6) produces a 16 bit digital word signal $B_{15}$–$B_0$; where $B_{15}$ is the MSB and $B_0$ is the LSB. Thus, the digital word signal represented by $B_{15}$–$B_0$ is greater than 9 by the amount not counted down by the up/down counter 77'. That is, the digital word signal represented by $G_4$–$G_0$ (or $B_{15}$–$B_0$ after being converted) plus the contents of up-down counter 77', $B_0$–$B_{10}$. Thus, here, in this example, the digital word signal $B_{15}$–$B_0$ indicates that the position of member 12' relative to member 14 is greater, or beyond, main position 9.

As the member 14' continues to move to the left so far that it reaches main resolution cell 8, a signal is produced on line $75_2$ again to set the contents of up-down counter 77' to logical 1, and the process is repeated.

Referring now to FIG. 7, an encoder 10" is shown for determining absolute position of a first member 12" with respect to a second member 14" to a resolution cell of L/512. Thus, here n=9. That is, encoder 10" is adapted to detect 512 positions; here, positions 0 to 511. As shown in FIG. 7, the encoder 10" is in the initial position; here position 0 Thus, here the first and second members 12" 4" are disposed in the X-Y plane, displaced from one another by a suitable distance along the Z-axis by a suitable bearing 50 (FIG. 9), and are adapted for relative movement along the Y axis by means of such bearing 50.

Referring again to FIG. 7, the first member 12" has m=3 tracks; here, tracks 30, 32, and 34 of binary indicia. Track 30 has binary indicia $42_1$–$42_{704}$; track 32 has binary indicia $46_1$–$46_{704}$; and track 34 has binary indicia $42_1$–$42_{704}$. The second member 14" has eighteen detectors arranged in three sets 35, 37, 39 of detectors; here, detectors $36_1$–$36_4$, $38_1$–$38_7$, and $40_1$–$40_7$, respectively, as shown. Each of the sets 35, 37, 39 of detectors $36_1$–$36_4$, $38_1$–$38_7$, and $40_1$–$40_7$ is adapted to detect the binary indicia $42_1$–$42_{704}$, $44_1$–$44_{704}$, $46_1$–$46_{704}$, respectively, in a corresponding one of the three tracks 30, 32, 34, respectively, as shown. The signals produced by detectors $40_7$–$40_1$ are A, B, C, D, E, F, and G, respectively, as indicated. The signals produced by detectors $38_7$–$38_1$ are H, I, J, K, L, M, and N, respectively, as indicated. The signals produced by detectors $36_4$–$36_1$ are O, P, Q, and R, respectively, as indicated. Thus, detectors $40_7$–$40_1$, $38_7$–$38_1$, $36_4$–$36_1$ produce a q=18 bit digital word signals ABCDEFGHIJKLMNOPQR- Such digital word signals, ABCDEFGHIJKLMNOPQR digital word signals, is a "cyclic", "unit-distance-code". Also because q=18>n=9, such digital word signals, ABCDEFGHIJKLMNOPQR, is an "excess-binary-code". The digital word signals ABCDEFGHIJKLMNOPQR produced by the detectors are decoded by a combinational logic section 28" to convert the signals into an n=9 bit binary word signal, $G_8G_7G_6G_5G_4G_3G_2G_1G0$; where $G_0$ is the least significant bit. The combinational logic section 28" combines the signals as follows:

$G_0$=A⊕C⊕E⊕G $G_1$=B⊕F $G_2$=D $G_3$=H⊕J⊕L⊕N $G_4$=I⊕M $G_5$=K $G_6$=P⊕R $G_7$=Q $G_8$=0

It should be noted that the detectors $40_1$–$40_7$ need not be disposed contiguous one another (i.e., have a center-to-center separation of 0 resolution cells); but may be separated as was discussed above in connection with detectors $26_1$–$26_3$ (FIG. 2) and detectors $26_1$–$26_3$ in FIG. A. It is noted that the the center-to-center separation, s, of the detectors $38_1$–$38_7$ above track 32 is, here 8 binary indicia or resolution cells. Thus, for p=2, ps−1=15; and, the detectors above track 32 may have a center-to-center separation of 15 resolution cells . Thus, in position 0, detectors $40_1$–$40_7$ may be disposed over binary indicia $46_8$, $46_{23}$, $46_{38}$, $46_{53}$, $46_{68}$, and $46_{83}$, respectively. Further, the binary indicia along track 34 must, in such arrangement, be changed from logical 0 to logical 1: binary indicia $44_{577}$–$44_{640}$; $46_{521}$–$46_{528}$; $46_{537}$–$46_{544}$; $46_{553}$–$46_{560}$; $46_{569}$–$46_{576}$; $46_{585}$–$46_{592}$; $46_{601}$–$46_{608}$; $46_{617}$–$46_{624}$; $46_{633}$–$46_{640}$; $46_{649}$–$46_{656}$; $46_{665}$–$46_{672}$; $46_{681}$–$46_{688}$; and, $46_{697}$–$46_{704}$.

It is noted that while an n=9 bit digital word signal is provided for each of the 512 positions, or resolution cells, only m=3 tracks are used in the encoder 10". The truth table for encoder 10" is shown in FIG. 8, and FIGS. 8A through FIG. 8T. Here, the track segments providing the binary indicia are high-energy Neodymium. The encoder 10" is adapted for use in a wide range of applications. One such application is in a linear actuator of the type described in U.S. Pat. No. 4,981,309, inventors Thomas A. Froeschle, Robert L. Marcesca and James A. Parison, issued Jan. 1, 1991, assigned to the same assignee as the present invention, the contents being incorporated herein by reference.

Referring to FIG. 9, a cross-section of such linear actuator having the encoder 10" is shown; such cross-section being in the X-Z plane. One member 12" has tracks 30, 32, 4 of binary indicia affixed thereto in slots 52, 54, 56, respectively, formed in member 12". The other member 14" has sets 35, 37, 39 of detectors affixed thereto. The members 12", 14" are adapted to move one with respect to the other by a bearing 50, as shown. It should be noted that set 35 of detectors is disposed in registration with track 30 of binary indicia; set 37 of detectors is disposed in registration with track 32 of binary indicia; and, set 39 of detectors is disposed in registration with track 34 of binary indicia. It should further be noted that set 39 of detectors and track 34 of binary indicia are disposed on one side, here the left side, of the bearing 50; while set 37 of detectors and track 32 of binary indicia together with set 35 of detectors and track 30 of binary indicia are disposed on the other side, here the right side, of the bearing 50. It is noted that a fourth slot 58 is provided in member 12" for insertion of a fourth track of binary indicia if greater resolution is desired. In such case, a fourth set of detectors would be mounted to the other member 14" in registration with the fourth track of binary indicia. The arrangement of having the tracks of binary indicia and its corresponding set of binary indicia detectors on different sides of the bearing 50 results in a compact encoder.

Other embodiments are within the claims. For example, while the pattern of binary indicia has been shown as a spatial pattern, the pattern may be a temporal pattern, as where the $2^n$ positions are time sequential numbers and instead of being affixed to positions along tracks, may be stored in stages of a shift register or other memory with the storage stages being selectively coupled to binary detectors.

What is claimed is:

1. An encoder for determining absolute position of a first member with respect to a second member, such absolute position being determined within a resolution cell of $L/2^n$, where n is an integer and L is a predetermined span, such encoder, comprising:

(a) a plurality of, m, absolute ecoding tracks of binary indicia disposed on the first member and distributed over the predetermined length, L, where m is an integer less than n;

(b) a plurality of indicia detectors for each track disposed on the second member for detecting the binary indicia on each track.

2. An encoder for determining position of a first member with respect to a second member, such position being determined to within a resolution cell of $L/2^n$, where n is an integer and L is a predetermined span, such encoder, comprising:

(a) a plurality of, m, absolute encoding tracks of binary state indicia disposed in a predetermined pattern on, and distributed over the predetermined span, L, of, the first member, where m is an integer less than n;

(b) a plurality of binary state detectors for each track disposed on the second member at predetermined positions thereof to detect a portion of the binary state indicia on each track in predetermined orientation with such detectors.

3. The encoder recited in claim 2 wherein a first portion of the detectors is disposed for detecting the binary states of the binary indicia disposed along a first one of the m tracks and a second portion of the detectors is disposed for detecting the binary states of the binary indicia disposed along a second one of the m tracks.

4. The encoder recited in claim 3 wherein the first portion of detectors includes a plurality of detectors disposed for detecting the binary indicia in the first one of the m tracks.

5. The encoder recited in claim 4 wherein the pattern of binary indicia of the first one of the m tracks comprises a set of consecutive binary indicia representing a first logic state and a succeeding, second set of binary indicia representing the complement of the first logic state.

6. The encoder recited in claim 5 wherein the pattern of binary indicia of a second one of the m tracks comprises a first set of consecutive binary indicia representing a first logic state, a succeeding, second set representing the complement of the first logic state, and a succeeding, third set representing the first logic state.

7. An encoder for determining position of a first member with respect to a second member, such position being determined to within a resolution cell of $L/2^n$, where n is an integer and L is a predetermined span, such encoder, comprising:

(a) a plurality of, m, absolute encoding tracks of binary state indicia disposed in a predetermined pattern on, and distributed over the predetermined span, L, of, the first member, where m is an integer less than n;

(b) a plurality of binary state detectors for each track disposed on the second member at predetermined positions thereof to detect a portion of the binary state indicia on each track in predetermined orientation with such detectors; and (c) a processor, responsive to signals produced by the plurality of binary state detectors, for producing a unit distance code representative of the determined position.

8. The encoder recited in claim 7 wherein the processor produces a cyclic, unit distance code.

9. An encoder comprising:

a) a first member having a plurality of absolute encoding tracks of binary state indicia disposed in a predetermined pattern thereon;

b) a second member having disposed thereon a plurality of sets of binary state detectors for each track, each set of detectors being adapted to detect the binary state indicia of a corresponding one of the tracks of binary indicia on each track;

c) a bearing adapted to enable relative movement between the first and second members; and d) wherein one portion of the tracks and the set of detectors corresponding thereto is disposed on one side of the bearing and another portion of the tracks and the set of detectors corresponding thereto is disposed on another side of the bearing and said one portion of the tracks and the set of detectors corresponding thereto is separated from said another portion of the tracks and the set of detectors corresponding thereto by a surface parallel to the path of relative movement between said first and second members and perpendicular to the plane of said tracks.

10. An encoder for determining position of a first member with respect to a second member, such position being determined within a resolution cell of $L/2^n$, where n is an integer and L is a predetermined span, such encoder, comprising:

(a) a plurality of, m, absolute encoding tracks of binary indicia disposed on the first member and distributed over the predetermined length, L, where m is an integer less than n;

(b) a plurality of sets of binary state detectors for each track disposed on the second member, each set of detectors being adapted to detect the binary state indicia on each track of a corresponding one of the tracks of binary indicia for detecting the binary indicia;

c) a bearing adapted to enable relative movement between the first and second members; and d) wherein one portion of the tracks and the set of detectors corresponding thereto is disposed on one side of the bearing and another portion of the tracks and the set of detectors corresponding thereto is disposed on another side of the bearing and said ode motion of the tracks and the set of detectors corresponding thereto is separated from said another portion of the tracks and the set of detectors corresponding thereto by a surface parallel to the path of relative movement between said first and second members and perpendicular to the plane of said track.

11. An encoder, comprising:

a first encoder for determining position of a first member with respect to a second member, such position being determined within a resolution cell of $L/2^n$ where n is an integer and L is a predetermined span; and, a second encoder decoder, responsive to signals produced by the first encoder, for determining position of a first member with respect to a second member, such position being determined within a sub-resolution cell of the aforementioned resolution cell, wherein the first encoder comprises:
(a) a plurality of, m, absolute encoding tracks of binary indicia disposed on the first member and distributed over the predetermined length L; and
(b) a plurality of sets of binary state detectors for each track disposed on the second member, each set of detectors being adapted to detect the binary state indicia on each track of a corresponding one of the m tracks of binary indicia for detecting the binary indicia on each track.

12. The encoder recited in claim 11 wherein the second encoder comprises an additional track of binary indicia disposed on the first member and distributed over the predetermined length, L; and, an additional binary state detector disposed on the second member, such additional binary state detector being adapted to detect the binary state indicia of the additional track of binary indicia.

13. The encoder recited in claim 12 including a processor responsive to signals produced by the plurality of detectors and the additional detector for producing a digital word signal representative of the position of the first member relative to the second member, the signals produced by the plurality of detectors providing an indication of a main portion of such position and the signals produced by the additional detector providing a vernier portion of the position.

14. The encoder recited in claim 13 wherein the processor detects a transition in main position and responds to the signals produced by the additional detector for producing the vernier portion of the position.

15. The encoder recited in claim 14 wherein m is an integer less than n.

16. The encoder recited in claim 11 wherein the first encoder is an absolute position encoder and the second encoder is an incremental position encoder.

* * * * *

UNITED STATES PATENT AND TRADEMARK OFFICE
CERTIFICATE OF CORRECTION

PATENT NO. : 5,574,445

DATED : 11/12/96

INVENTOR(S) : Maresca et al.

It is certified that error appears in the above-identified patent and that said Letters Patent is hereby corrected as shown below:

Column 1, line 16, "0,001" should read --0.001--.

Column 2, line 34, after "L/$2^n$" insert --,--.

Line 35, before "The" insert --.--.

Column 3, line 32, "ST" should read --8T--.

Line 53, "i" should read --1--.

Column 4, line 31, "20-2016" should read --$20_1$-$20_{16}$--.

Column 5, line 2, "22 45-2248" should read -- $22_{45}$-$20_{48}$--.

Line 21, "The output signals" should begin a new paragraph.

Line 63, "G4G3G2GiG0" should read --$G_4G_3G_2G_1G_0$--.

Line 64, after "positions" insert --,--.

Column 6, line 36, "It is first noted" should begin a new paragraph.

Line 46, "$2^n$" should read --$2^q$--.

Column 7, line 17, "263,262,261" should be --$26_3 26_2 26_1$--.

UNITED STATES PATENT AND TRADEMARK OFFICE
CERTIFICATE OF CORRECTION

PATENT NO.   : 5,574,445

DATED        : 11/12/96

INVENTOR(S)  : Maresca et al.

It is certified that error appears in the above-identified patent and that said Letters Patent is hereby corrected as shown below:

Line 60, "$65_{65}$" should read --$65_1$--.

Column 8, line 20, "752" should read --$75_2$--.

Line 50, after "FIG." insert --5);--.

Line 57, after "counter" insert --77--.

Column 9, line 37, "i" should read --1--.

Column 10, line 6, after "0" insert --.--.

Line 7, after "12" insert --,--.

Line 27, "-" should be --.--.

Line 35, "GO" should be --$G_0$--.

Line 48, "0" should be --O--.

Line 53, "$26_1$-$26_3$" should read --$26'_1$-$26'_3$-- and before "A" insert --2--.

Line 58, there should be no space between "cells" and ".".

Column 11, line 3, "ST" should be --8T--.

Line 12, "4" should be --34--.

Line 49, "ecoding" should be --encoding--.

UNITED STATES PATENT AND TRADEMARK OFFICE
CERTIFICATE OF CORRECTION

PATENT NO.   : 5,574,445
DATED        : 11/12/96
INVENTOR(S)  : Maresca et al.

It is certified that error appears in the above-identified patent and that said Letters Patent is hereby corrected as shown below:

Column 12, line 23, "deterdining" should be --determining--.

Line 19, "ode motion" should be --one portion--.

Line 25, "track" should be --tracks--.

Signed and Sealed this

Fourteenth Day of April, 1998

Attest:

BRUCE LEHMAN

*Attesting Officer*       *Commissioner of Patents and Trademarks*